United States Patent [19]

Cowan et al.

[11] Patent Number: 4,708,459

[45] Date of Patent: Nov. 24, 1987

[54] ELECTROPHOTOGRAPHIC COLOR PROOFING APPARATUS AND METHOD

[75] Inventors: Carl E. Cowan, Rochester; Anthony R. Lubinsky, Webster; Thomas W. Nylund, Rochester; Malcolm R. Specht, Rochester; John P. Spence, Rochester, all of N.Y.

[73] Assignee: Eastman Kodak Company, Rochester, N.Y.

[21] Appl. No.: 838,637

[22] Filed: Mar. 11, 1986

[51] Int. Cl.⁴ .................... G03G 15/01; G03G 13/01
[52] U.S. Cl. ........................ 355/4; 355/3 R; 355/40; 355/71; 355/77; 430/30; 430/43
[58] Field of Search ............ 355/3 R, 4, 40, 71, 355/77; 430/30, 42, 43

[56] References Cited

U.S. PATENT DOCUMENTS

| | | | |
|---|---|---|---|
| 3,086,709 | 4/1963 | Simmon et al. | 235/184 |
| 3,227,039 | 1/1966 | Simmon | 88/24 |
| 3,510,221 | 5/1970 | Berman | 355/77 |
| 4,220,700 | 9/1980 | McGuckin et al. | 430/143 |
| 4,256,401 | 3/1981 | Fujimura et al. | 355/14 E |
| 4,293,216 | 10/1981 | Moore | 355/77 |
| 4,361,395 | 11/1982 | Washio et al. | 355/14 R |
| 4,425,417 | 1/1984 | Ingalls et al. | 430/30 |
| 4,519,695 | 5/1985 | Murai et al. | 355/14 R |
| 4,521,097 | 6/1985 | Kuehnle et al. | 355/3 R |

OTHER PUBLICATIONS

Journal of Photo Science, vol. 3; 1955, pp. 112–116.

*Primary Examiner*—Fred L. Braun
*Attorney, Agent, or Firm*—Dennis R. Arndt

[57] ABSTRACT

Electrophotographic color proof generating apparatus includes a charger station, an exposure station, and a development station. Starting with color half-tone separations of artwork, the apparatus, using a unique method, electronically controls the exposure and potentials at the charger and development stations to generate a proof. The apparatus is designed to generate proofs which match the dot gain or loss and density of press sheets printed by a great variety of commercial presses starting with the same separations as are used to form the proofs. The separations are then modified until the apparatus generates a proof which is an acceptable reproduction of the artwork. The modified separations are then used to generate a press sheet on the commercial press which will be an acceptable reproduction of the artwork.

65 Claims, 30 Drawing Figures

DOT GAIN VS. EXPOSURE
AT NOMINAL WORKING VOLTAGES
IN NEG/POS MODE

DOT GAIN VS. WORKING DELTA V
AT WORKING DELTA V'=100, EXPOSURE=1800
IN NEG/POS MODE

DOT GAIN VS. WORKING DELTA V'
AT WORKING DELTA V=125, EXPOSURE=1800
IN NEG/POS MODE

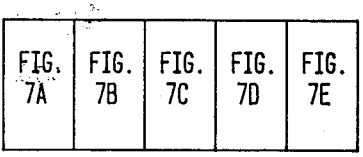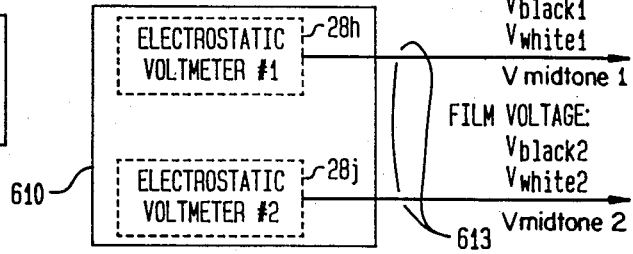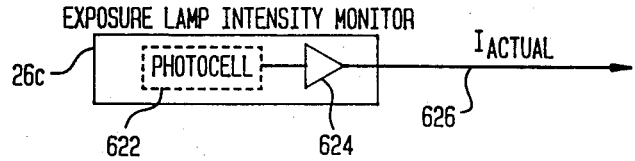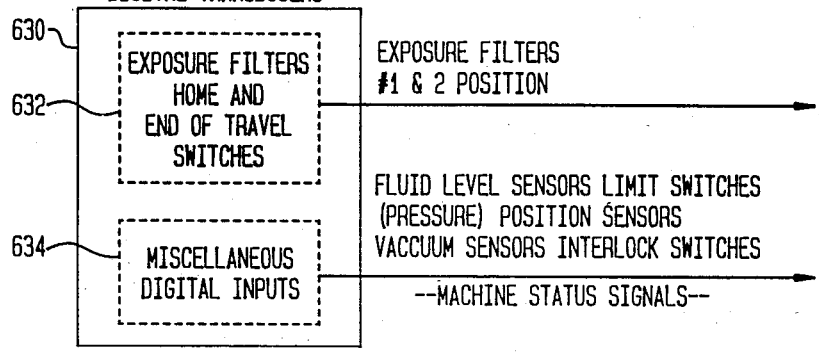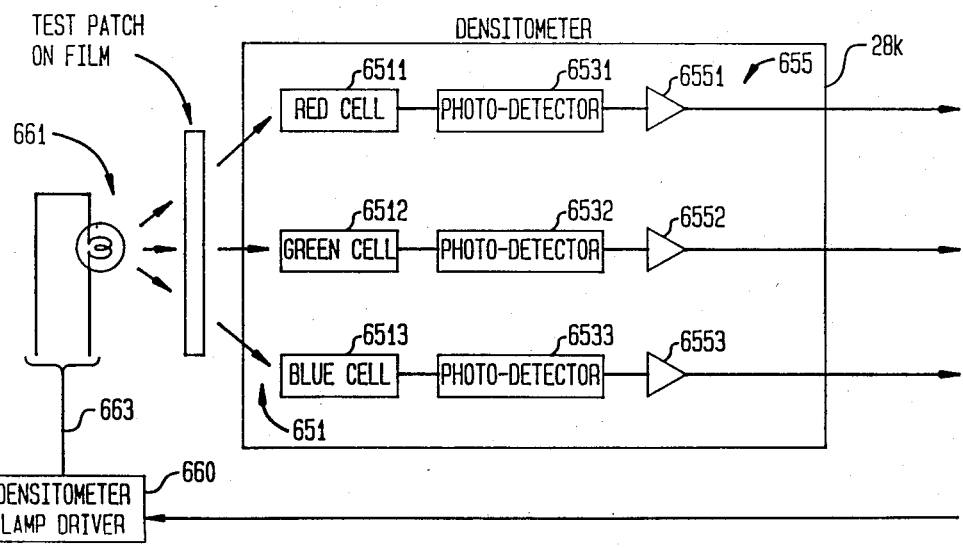

FIG. 7B
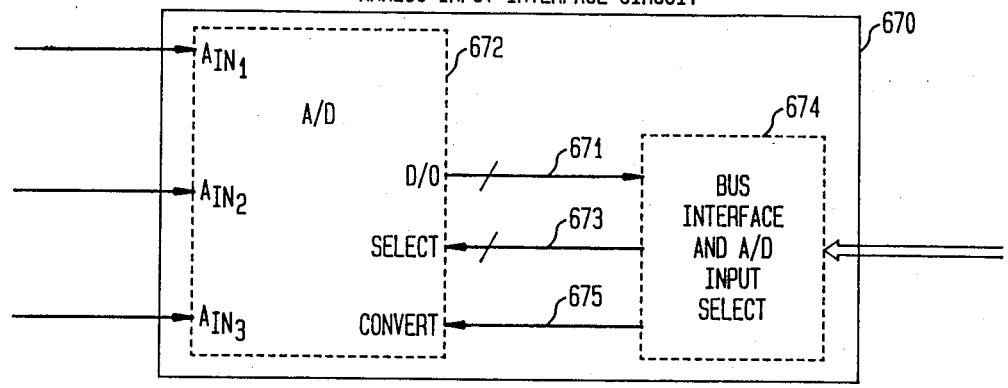
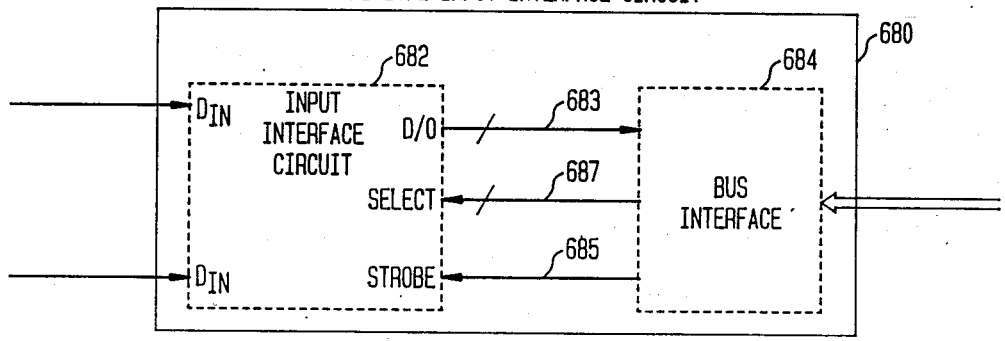
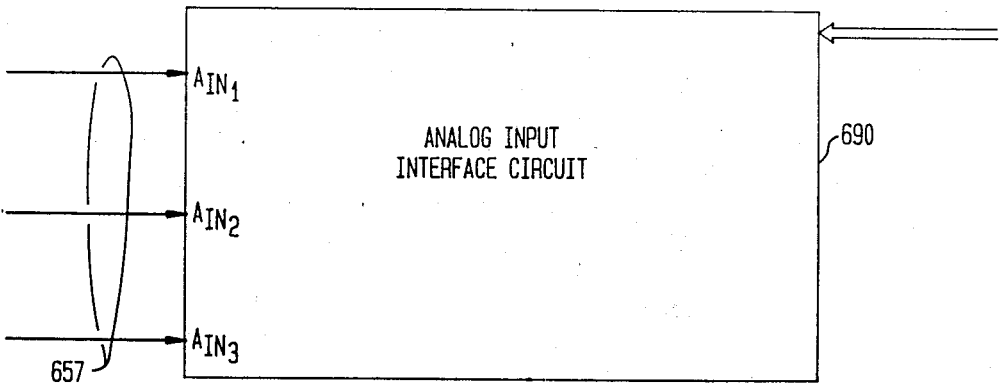

USER INPUT ROUTINE 820

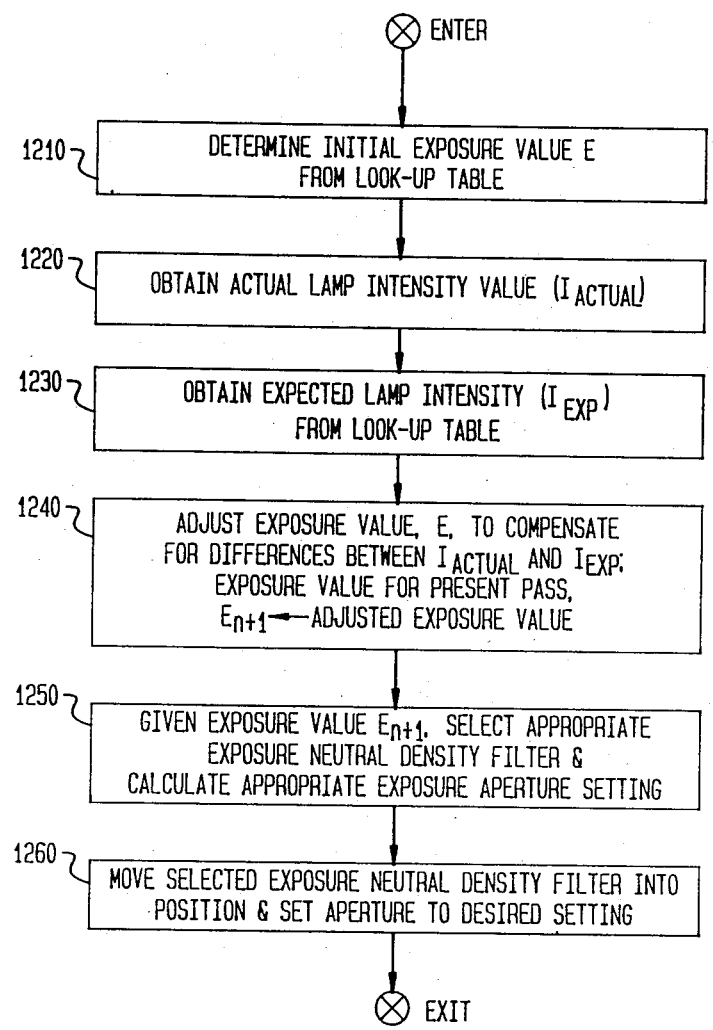

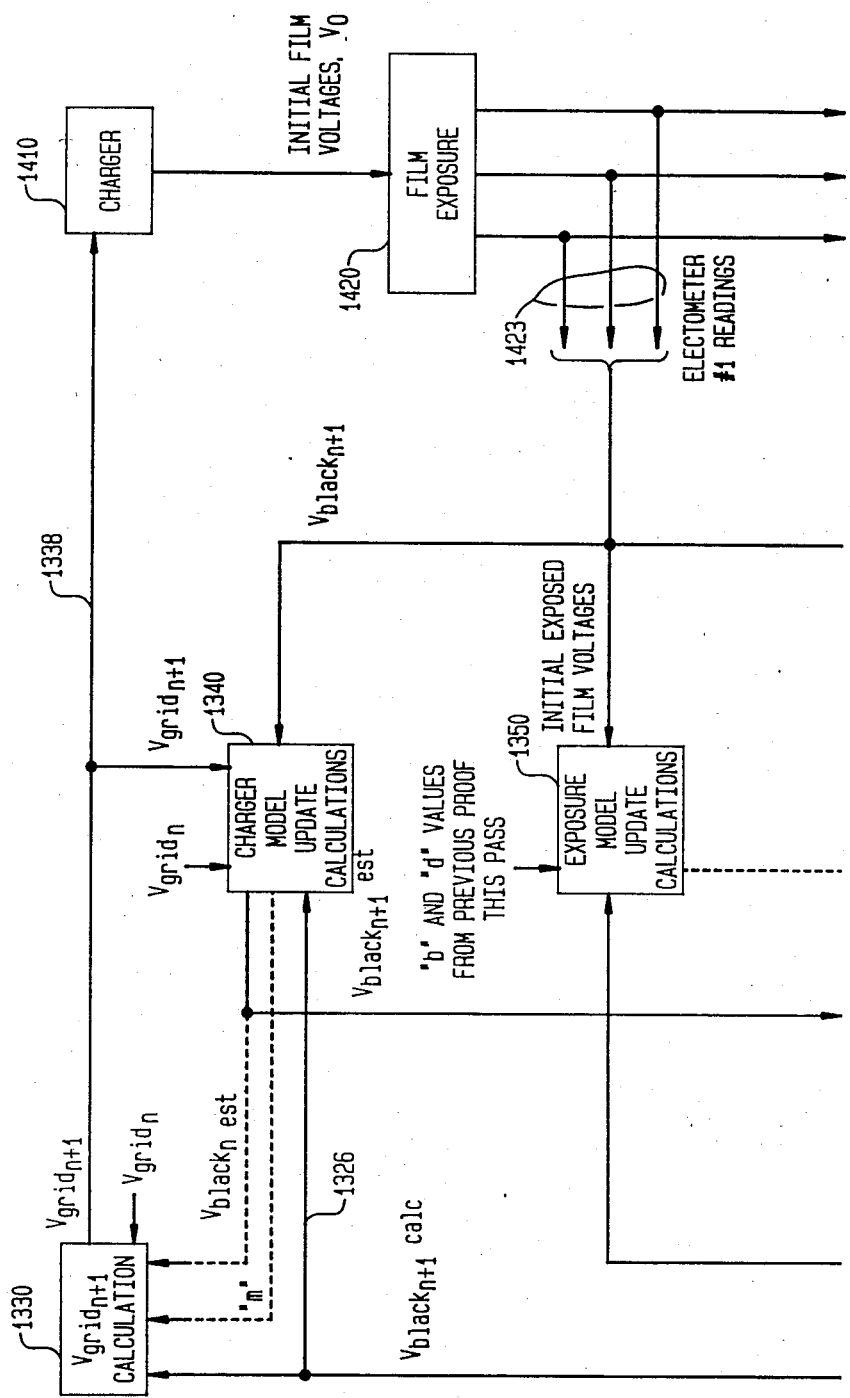

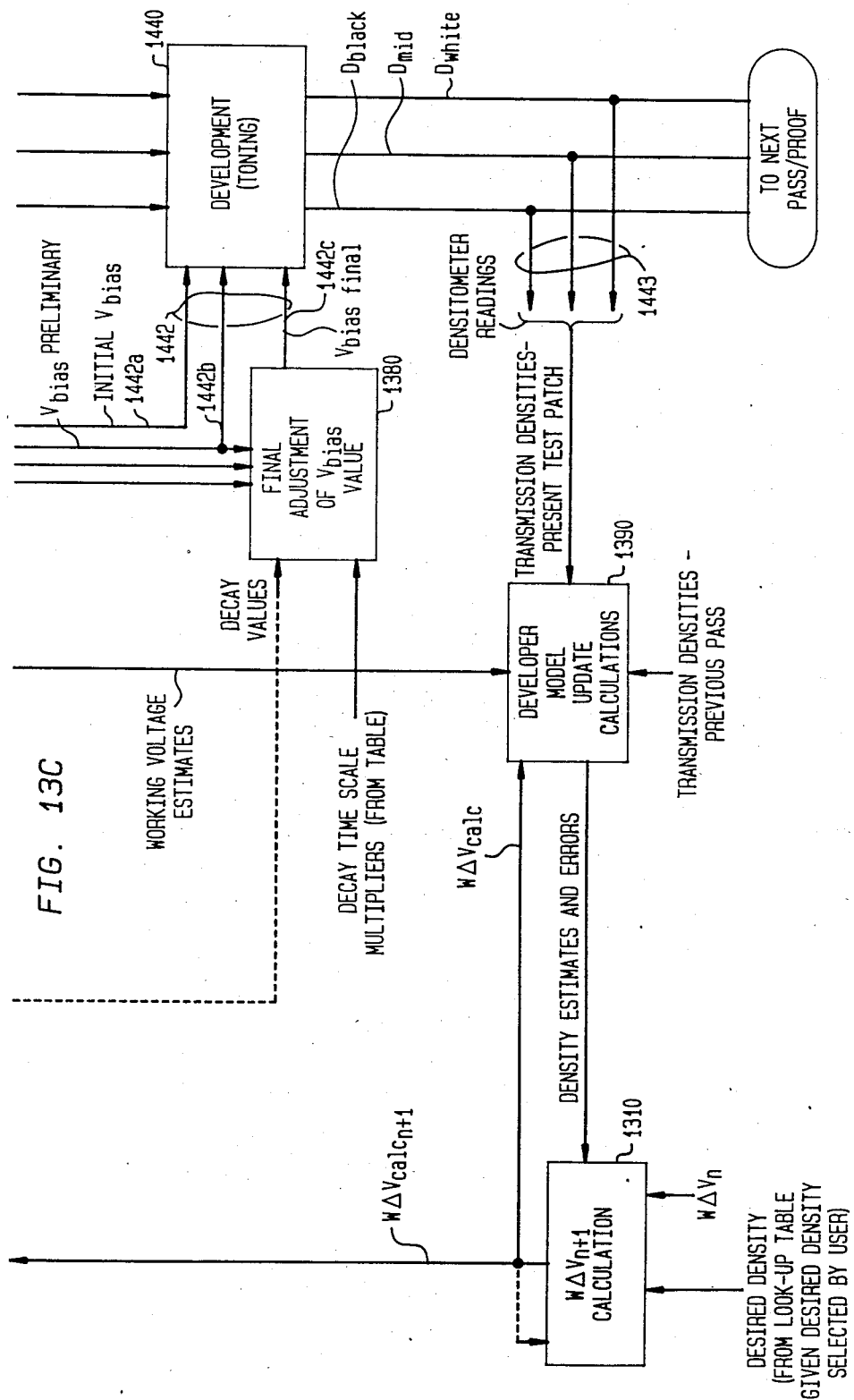

ELECTROPHOTOGRAPHIC COLOR PROOFING APPARATUS AND METHOD

TECHNICAL FIELD OF INVENTION

This invention relates to color printing and in particular to apparatus and methods for producing from color separations derived from an artwork, a high quality color proof which is indicative of the quality of press sheets that are subsequently mass produced on printing presses.

BACKGROUND OF THE INVENTION

Original artworks (i.e., photographs, hand drawn pictures, hand or machine drawn advertising, computer generated images, etc.) are typically converted from continuous tone to half-tone (dot matrix format) in order to facilitate mass production of the work on a printing press. Color original artworks are generally separated into four half-tone color separations which are hereinafter denoted as "separations". Each half-tone separation carries image information of a separate one of the four colors of the artwork. In some instances an original color artwork is converted into five or more separations. The separation process can be achieved in a number of well known ways. A camera may be used to take a picture of images resulting when different color filters are placed in front of an art object which is illuminated. A graphic arts scanner may also be used to create the separations. The separations are typically formed on silver films. A color proof image (hereinafter a "proof") is produced from the separation films and is visually compared to the original artwork. The separations are approved if the proof is judged to be an acceptable reproduction of the original artwork. The image of each separation is then reproduced using well known techniques on a separate printing plate which typically is an aluminum sheet with an organic film coating. The printing plates are then used successively to print the contained images onto a medium such as paper, metal, plastic, or fabric. This medium containing an image reproduction of the original artwork is known as a press sheet. One example of a publication which generally uses high quality press sheets is an annual business report.

One problem is that even if the proof is a close reproduction of the original artwork, the final press copies may not be. There are on many occasions ascertainable variations in tone scale and color reproduction between the press copy and the original artwork which are not acceptable to the reviewer. One basic reason for the variations is that different printing presses and various media on which the final image is printed produce different amounts of "dot gain". Dot gain is the increase in the visually perceived size of printed dots over the actual size of corresponding dots on the separations. Accordingly, even though separations provide an acceptable proof, they do not in many cases provide an acceptable press sheet.

Various proof generating equipment is offered commercially. 3M Company markets, under its trademark "Color-Key", pre-press proofing materials involving pre-sensitized ink pigment coatings, in either transparent or opaque colors, on transparent polyester base sheets. Each pigment coating is intended to be correlated with various process color printing inks. Each primary color and black "Color-Key" sheet is overlaid by its associated separation negative and after exposure and development, the four "Color-Key" Sheets are overlaid in register to provide a "proof" or simulation of what the four-color work will look like when printed. The high contrast characteristic of a photopolymer used makes it extremely difficult to control dot size by varying illumination. It is also essentially impossible to control overall density because a given amount of the pigment is already dispersed in the photopolymer and therefore cannot be variably removed to decrease density. This pre-press proofing system falls well short of providing the user with a fully accurate proof in the sense of the colors, color registry and texture of the color work when a press prints with ink on paper.

3M Company also markets a pre-press color proofing system under the trademark "Transfer-Key", which is said to provide a complete four-color proof on a single sheet. In this system, factory pre-coated carrier sheets of color pigment, respectively bearing cyan, yellow, magenta and black pigment, are successively manipulated to laminate each pigment onto the base material by use of their proprietary laminator. Specifically, a cyan pigment layer of the carrier sheet is first laminated to the base material, which is then exposed to the cyan separation negative and the sheet then developed in a proprietary processor. The same lamination/exposure/development cycle is repeated with each color, producing the four-color proof. Pre-coated pigment carrier sheets are available only in certain colors, unless specially ordered. As manifest, such color proofing procedure, although providing a single sheet color proof, is of limited applicability and is inherently rather slow in cycle time in that each pigment layer of the four-color proof must be separately and successively laminated, exposed and developed.

3M Company also markets a color proofing system under its trademark "Matchprint II" which allegedly retains the advantages of "Transfer-Key" proofs, but incorporates a single level of optical gain in order to try and accurately simulate the press gain normally encountered in today's high speed web publication printing industry.

Another commercially available pre-press color proofing system is marketed by the DuPont Company, under the trademark "Cromalin". The film used therein has an originally sticky surface which when selectively exposed to light becomes nonsticky in the exposed area. Pigment toners are then rubbed onto the surface and stay in the sticky areas. This provides little flexibility in varying dot size and density. In the "Cromalin" color proof system, dry pigment toners are factory "calibrated" to printing ink colors and each primary and black color reproduction is on a separate sheet of photopolymer film, the films being laminated, exposed and toned one layer after the other. The cycle time for this system is said to be "within an hour", rather than the hours or days required for press proofing.

One serious limitation of all of these commercially available systems is that they have a fixed dot gain and therefore can only simulate combinations of printing presses and media which have similar levels of dot gain. Another limitation is that the proofs provided by these systems are not always as consistent as is desired by some in the graphic arts industry.

It has been recognized that dot gain observed in press sheets can be controlled to some extent by varying the amount of light passing through a separation when exposing a press plate. Increasing light intensity and/or exposure time increases dot gain where the final positive press sheet is produced from a printing plate formed from a negative separation. Increasing light intensity and/or exposure time decreases dot size where the final positive press sheet is produced from a positive separation. The article entitled "Research Completed on Modifying Dot Gain", Offset Printers, No. 162; July, 1982, page 25, states: "The dot gain occuring between film and print can be significantly reduced by increased exposure during printing plate making. The resulting print, however, shows disproportionate sharpening in the highlight and middle tone when compared to the shadow tones. It is not, therefore, recommended as an ideal way to compensate for excessive gain."

In some instances a proof press plate is formed from initial separations and a proof press sheet is printed. If the press proof is not an acceptable reproduction of the artwork, the separations are modified. A new proof press plate is formed from the modified separations and another press sheet is printed. This process is repeated until the resulting press sheet is an acceptable reproduction of the artwork. The proof press printing plate is not always an acceptable reproduction of a production printing plate and the proof press does not always perform in an identical manner to the production printing press. Accordingly, even though the proof press sheet may have an acceptable relationship to the original artwork, the production press sheet may not. In addition, the use of proof press plates and proof press printing therefrom is a very expensive and time consuming process.

It is therefore desirable to be able to consistently and relatively quickly and easily generate a color proof that has an acceptable relationship to the artwork and to a press sheet.

SUMMARY OF THE INVENTION

Viewed from one aspect, the present invention is directed to electrophotographic color proofing apparatus for generating from half-tone color separations derived from an artwork, a proof having dots of essentially the same size as dots of a press sheet printed on a commercial press which uses printing plates derived from the same separations. The apparatus comprises charging, exposing, and development means which are all under the control of dot size control means which is typical control electronics. The control electronics varies the amount of exposure and potentials applied to the charging and developing means to control the size of dots formed on the proof. Thus the apparatus adjusts the parameters of operation such that a generated proof contains dots which have essentially the same size as the dots of the press sheet. The proof is then said to be calibrated to the press sheet. The separations can now be modified until the resulting proof is an acceptable reproduction of the artwork. It is then known that a press sheet subsequently derived from the modified separations on a commercial printing press will be an acceptable reproduction of the artwork.

Viewed from another aspect, the present invention is directed to apparatus for generating from half-tone patterns, a proof which is formed of dots and is derived from a component of a record member that is adapted to maintain an electrical pattern. The proof has an acceptable relationship to a press sheet printed on a printing press which uses printing plates derived from the same half-tone patterns. The apparatus comprises a forming means for forming an electrical pattern on the record member which is a reproduction of the half-tone patterns. The forming means is operative in response to a signal. The apparatus further comprises dot size control means for generating and controlling the signal so as to control the size of dots formed on the proof. The record member is adapted to facilitate generation of a proof which comprises a visual representation comprised of a plurality of dots of the electrical pattern. The proof has an acceptable relationship to a press sheet printed on a printing press which uses printing plates derived from the same half-tone patterns.

Moreover, in accordance with the principles of the present invention, the process which controls the inventive proofing system relies on mathematically modelling each of four electrophotographic processes that occur within the system, namely; charging, exposure, film voltage decay and development (toning). In essence, these models are used to accurately predict actual system performance occurring during any toning pass and provide appropriate values of the controlled parameters (voltages $V_{grid}$ and $V_{bias}$ and the exposure setting) to maximize system performance during the next successive toning pass. Actual measurement data is used to update these models at the conclusion of any pass. This cycle of performance prediction/parameter estimation followed by model updating is repeated for each successive toning pass.

To yield highly accurate performance, the control process executes two basic phases: calibration and toning. In operation, the calibration phase is run when required. During this phase, the system obtains film voltage measurements and estimates certain parameters indicative of the performance of the electrophotographic charging, exposure and decay processes that actually occur in the inventive proofing system. The calibration phase consists of only one pass during which no toning occurs. The result of the calibration phase is a set of parameter values for use during the subsequent toning phase. The calibration phase is run in specific instances before the toning phase begins in order for the system to establish a set of valid initial conditions.

Once a calibration phase, when same is used, is completed, the toning phase begins. During each successive toning pass, the system first predicts system performance and calculates the values of various controlled process parameters, by inverting the models using updated values from the previous pass or proof, in order to set the controlled process parameters (the voltages $V_{grid}$ and $V_{bias}$, and the exposure settings) correctly. Actual process data (transmission densities and film voltages under conditions of varying exposure and at varying times) occurring during that pass are measured. These measurements are then used to update all the models, i.e. through updating all the process parameter estimates used therein, for use during subsequent toning passes. The performance prediction/parameter estimation and updating processes are again repeated during each successive toning pass.

In particular, the control process used in the inventive system utilizes four empirically derived mathematical models: a charger model, an exposure model, a decay model and a developer (toning) model. The charger model mathematically predicts the voltage placed onto the film by the charging grid. The unexposed film voltage ($V_{black}$) is linear with charging grid voltage ($V_{grid}$). The exposure model estimates post-exposure film voltages ($V_{white}$, $V_{Midtone}$) that occur in test areas on the film that have been exposed to normal and reduced levels of light. These post-exposure film voltages are non-linear functions of the actual exposures. The decay model estimates the voltage decay experienced by the film once it exits the exposure station. The decay is a linear function of the unexposed film voltage and is extrapolated over time using a time scaling multiplier. Lastly, the developer model estimates the transmission density of the toned image given the working development voltage (W$\Delta$V), i.e. the voltage difference occurring at the start of development between areas of the film to be toned and that of the developing means ($V_{bias}$). The transmission density is a linear function of the working development voltage.

BRIEF DESCRIPTION OF THE DRAWINGS

These and other teachings of the invention will be better understood by considering the following detailed description in conjunction with the accompanying drawings.

FIG. 7 is a diagram showing the proper alignment of the drawing sheets for FIGS. 7A–7E;

FIGS. 7A–7E collectively show a block diagram of the electronic circuitry used in the inventive system;

FIG. 12 is a flowchart of Set Exposure Routine 1010 shown in FIGS. 10 and 11;

FIG. 13 is a diagram showing the proper alignment of the drawing sheets for FIGS. 13A–13C;

FIGS. 13A–13C collectively depict a detailed flowchart of the toning control algorithms used in the inventive system.

To facilitate understanding, identical reference numerals have been used to designate identical elements common to the figures.

DETAILED DESCRIPTION

Figure 1:
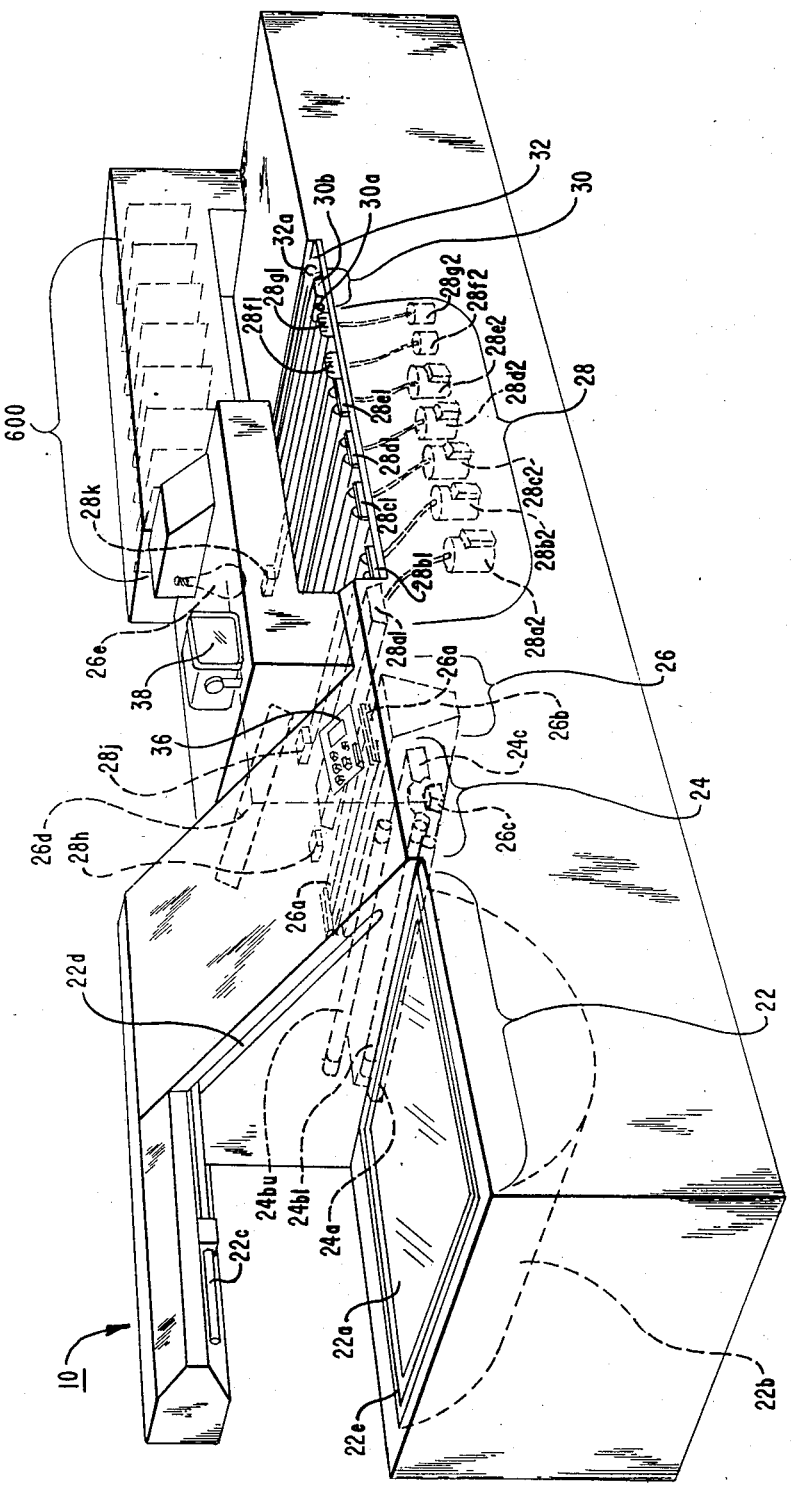
FIG. 1 illustrates a perspective view of one embodiment in accordance with the present invention.

Referring now to FIG. 1, there is illustrated a perspective view of electrophotographic color proof generating apparatus 10 in accordance with the present invention. Apparatus 10 comprises stations 22, 24, 26, 28, 30, and 32, control electronics 600, an operator control panel 36, and a display device 38. It facilitates the relatively rapid generation of a high quality proof (not illustrated) formed on a photoconductive film (PC) (not illustrated in FIG. 1) from a set of half-tone color separations (not illustrated in FIG. 1) (also known as "separations" or "separation films") which are derived from artwork (not illustrated). Embodiments of a PC and a separation that are useful with apparatus 10 are illustrated in FIG. 5D and are discussed hereinbelow.

Control electronics 600 control light exposure of the PC at station 26, and potentials applied at stations 24 and 28 such that a proof generated by apparatus 10 on a PC has a preselected density and dots having essentially the same size as dots of a press sheet printed on a commercial printing press. Printing plates (not illustrated) of a commercial press (not illustrated) are derived from the same separations used to generate the proof. The proof is said to be "calibrated" to the press sheet when the dot sizes on both are essentially the same. Thus the proof is an acceptable reproduction of the press sheet. The proof is now compared to the artwork. The press sheet will be an acceptable reproduction of the artwork if the proof is an acceptable reproduction of the artwork. If the proof is not an acceptable reproduction of the artwork, the separations are modified by well known techniques and a new proof generated using apparatus 10. The new proof is then compared to the artwork. This procedure is repeated until a proof generated by apparatus 10 is an acceptable reproduction of the artwork. The separations used to generate the acceptable proof are then used to form press plates for the commercial press. A press sheet is then printed on the commercial press. The press sheet so printed will be an acceptable reproduction of the artwork since the proof is calibrated to the press sheet and the proof is an acceptable reproduction of the artwork.

A press sheet which is a positive reproduction of an artwork can be formed from a set of negative or positive separations. When negative separations are used to form a printing plate there is a tendency of the dot size formed on the plate to be somewhat greater than that of the dot size of the separations. This is a contributing factor to dot gain. When positive separations are used to form a printing plate there is a tendency of the dot size formed on the plate to be smaller than that of the dot size of the separations. This is known as dot loss or dot sharpening. When a commercial press prints a press sheet on media such as paper, there is a tendency of the dot size on the press sheet to be greater than on the printing plate independent of whether negative or positive separations and printing plates were used in the printing process. This is the primary contributor to dot gain. Apparatus 10 is adapted to be able to modify the dot size, within preselected limits, to generate a proof image. The proof image is laminated onto paper which is typically the same kind of paper used for a press sheet. This combination of the proof image and the paper is denoted as a "completed proof" or as a "proof". The proof is an acceptable reproduction of a press sheet whether the press sheet has dots which are greater or lesser in size than the dots of the separations from which they were derived. The image proof may also be hereinafter referred to as a "proof".

Once a proof generated using apparatus 10 is calibrated to a press sheet, a printer knows with a relatively high degree of assurance that press sheets produced on his commercial printing press will be as good a reproduction of the artwork as the proof is.

Station 22 comprises a platen 22a which is essentially a flat glass member mounted on a metal frame which is part of a horizontally movable carriage. Station 22 also comprises a semicylindrical member 22b having an opening disposed below platen 22a, a lift arm 22c, a slot opening 22d, platen end clamps (not illustrated) to hold down a PC, and grounding clamps (not illustrated) to a conductive (ground) layer of the PC. Member 22b is situated such that platen 22a can be selectively rotated 180 degrees. Platen 22a further comprises a groove 22e therein to which a vacuum line (not illustrated) can be attached to cause a separation and a PC placed on platen 22a to closely adhere to each other and to the glass portion of platen 22a. The PC is placed on platen 22a, the grounding clamps are activated, and lift arm 22c lifts one edge of the PC. A separation is placed under it. The PC is then lowered, the platen end clamps are activated, and a rubber roller (not illustrated) is rolled over the PC and separation to cause any air trapped therebetween to move to the outer edges where it is removed through groove 22e. Platen 22a is then rotated 180 degrees through 22b. Station 22 may be denoted as the load/unload station or load/unload position.

Station 24 comprises an autobuff roller 24a, upper 24bu and lower 24bl light erase fluorescent lamps, and a charger apparatus 24c. Autobuff roller 24a is a roller whose position is selectively adjusted so as to make contact with and clean off a PC as it passes station 24. Examples of autobuff rollers useful with apparatus 10 are given in U.S. patent application Ser. No. 837,973 filed Mar. 10, 1986, entitled METHOD AND APPARATUS FOR IMPROVING A MULTI-COLOR ELECTROPHOTOGRAPHIC IMAGE filed in the name of R. S. Jones, which is copending with the present application and in which there is a common assignee. Upper 24bu and lower 24bl lamps are selectively turned on to cause a PC which was previously charged by portions of apparatus 10 to be discharged.

Figure 2:
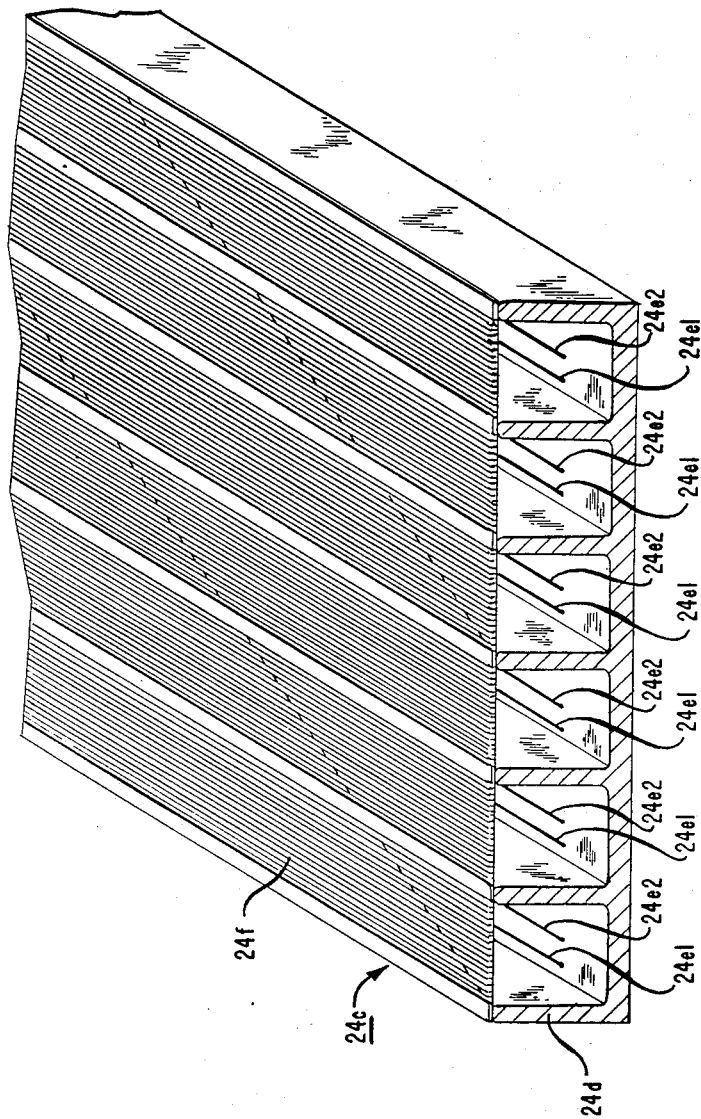
FIG. 2 illustrates details of a portion of the embodiment of FIG. 1.

Charger apparatus 24c is used to place a charge on a PC film. An exploded cross-sectional view of part of charger apparatus 24c is illustrated in FIG. 2. Charger apparatus 24c comprises a support member 24d having six U-channels with each U-channel having first and second corona wires 24e1 and 24e2 suspended therein and a grid of closely spaced and electrically connected grid wires 24f covering an open portion of the six U-channels. Corona wires 24e1 and 24e2 are, in a preferred embodiment of charger apparatus 24c, coupled to a high voltage, current controlled 600 Hz power source and serve as a source of ions which are controlled by an electric field created when a potential is applied to grid wires 24f. These ions are collected on a surface of the PC which passes over charger apparatus 24c during the operation of apparatus 10. Charger apparatus 24c has been found to be very efficient in that same delivers an essentially uniform charge onto a surface of the PC which results in the PC surface being set to essentially the potential level, $V_{grid}$. $V_{grid}$ is the potential applied to the grid wires 24f of charger apparatus 24c. The basic operation of chargers of this general type is well known and is discussed in U.S. Pat. No. 3,527,941, issued Sept. 8, 1970 and assigned to a common assignee. Another suitable charging apparatus may be found in U.S. patent application Ser. No. 812,710, entitled "Corona Generating Device", filed Dec. 23, 1985, in the names of David D. Almeter et al, also assigned to a common assignee. Charger apparatus 24c may also be denoted as a charging means.

Figure 3:
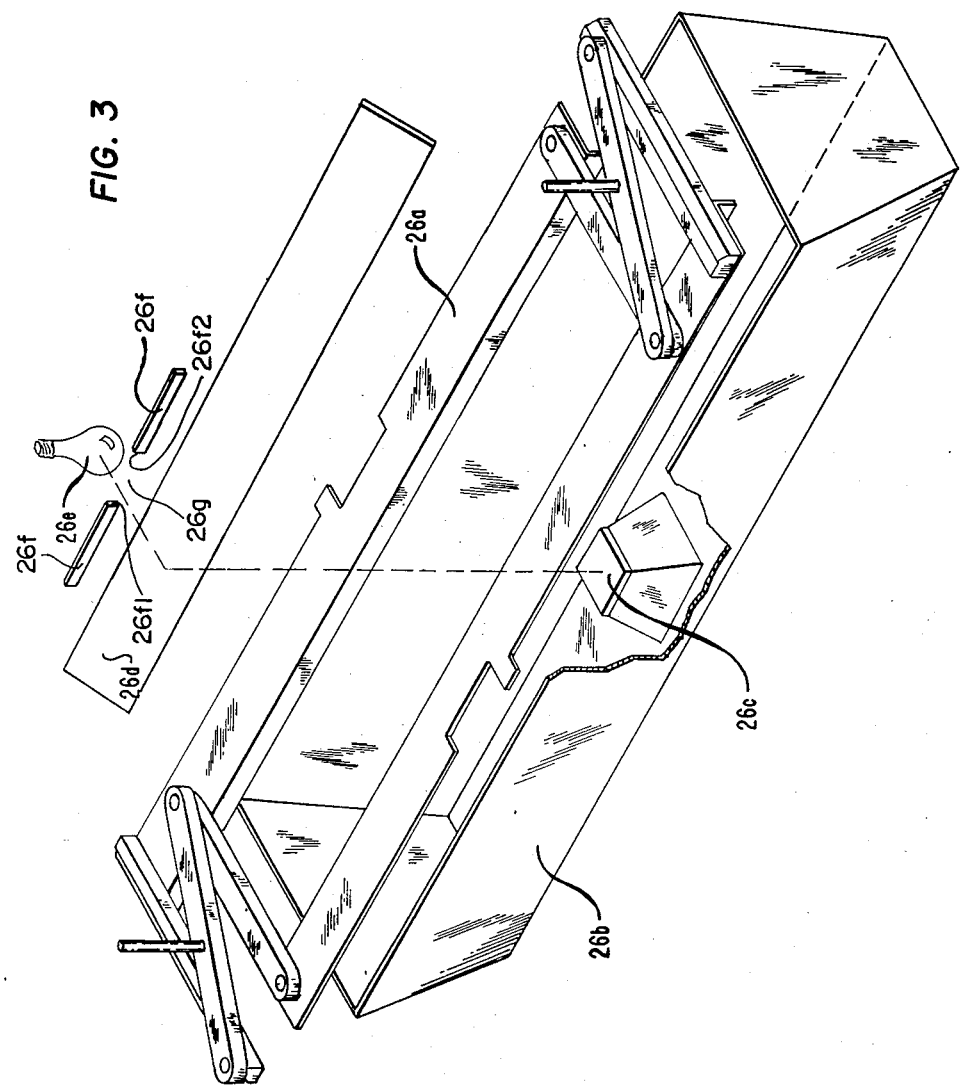
FIG. 3 illustrates details of another portion of the embodiment of FIG. 1.

Station 26, which is also illustrated in enlarged form with an additional component in FIG. 3 and in part in FIG. 5D, comprises a shutter apparatus 26a, a V-groove chamber 26b, a light intensity monitor 26c, a mirror 26d, and a light source 26e. Station 26 also includes a mask 26f (illustrated in FIG.'s 3 and 5D) which has an aperture 26g defined by edges 26f1 and 26f2. Mask 26f controls the passage of light emitted by light source 26e. Light emitted by light source 26e passes through aperture 26g of mask 26f and is then reflected by mirror 26d downward through the glass portion of 22a and through a separation and PC mounted on 22a. Mirror 26d is not illustrated in FIG. 5D. V-groove chamber 26b has a light intensity monitor 26c centrally located therein. Light intensity monitor 26c is adapted to provide an output electrical signal which is coupled to control electronics 600. Control electronics 600 provide control signals which cause a motor (not illustrated) to open or close shutter apparatus 26a so as to regulate the amount of light incident on a PC passing under shutter apparatus 26a. Control electronics 600 also control the speed of platen 22a as it passes under shutter apparatus 26a and control filters (not illustrated) which can be placed in front of light source 26e to modify the amount of light which reaches a PC.

Station 28 comprises a first electrometer (also known as an electrostatic voltmeter) 28h, prewetting apparatus 28a1 and a pump and reservoir 28a2 for same, first development electrode-toner apparatus 28b1 and a pump and reservoir 28b2 for same, a second electrometer (also known as an electrostatic voltmeter) 28j, second development electrode-toner apparatus 28c1 and a pump and reservoir 28c2 for same, third development electrode-toner apparatus 28d1 and a pump and reservoir 28d2 for same, fourth development electrode-toner apparatus 28e1 and a pump and reservoir 28e2 for same, first rinse apparatus 28f1 and a pump and reservoir 28f2 for same, a densitometer 28k, and a second rinse apparatus 28g1 and a pump and reservoir 28g2 for same. Apparatus 28b1, 28c1, 28d1, and 28e1 are denoted as a development toner station or development means.

Prewetting apparatus 28a1 selectively causes a liquid, typically ISOPAR G, which is a trademark of Exxon, to coat a PC film which passes over 28a1. Apparatus 28b1, 28c1, 28d1, and 28e1 hold yellow, magenta, cyan and black colored toner, respectively, and each comprise first and second roller-electrodes which are selectively held at a potential, $V_{bias}$, determined and controlled by control electronics 600. During a cycle of use of apparatus 10 when toner is applied to a PC, only one of the development apparatus is positioned to allow toner contained therein to be applied to a PC. It thus takes four cycles of operation of apparatus 10 to apply each of the four different colors of toner to a PC. Electrometers 28h and 28j measure the potential of selected test patch areas of a PC film as the PC film passes by each of same. Output voltage readings of electrometers 28h and 28j are coupled to the control electronics 600 which use this information to control the potential, $V_{grid}$, applied to a PC by charger apparatus 24c and to control a potential $V_{bias}$ applied to the two roller electrodes of each the development electrode-toner apparatus.

Densitometer 28k measures the density of test patch areas on a PC as these areas of the PC move over densitometer 28k. Output signals from 28k are coupled to control electronics 600. Control electronics 600 adjust $V_{grid}$ and $V_{bias}$ such that apparatus 10 generates a proof having a solid area density which is the same as is desired. Each of the development electrode-toner apparatus has a skive (not expressly illustrated) which is adapted to allow a jet of air to be short up against the film so as to remove excess toner (not illustrated) which then falls into a receiving portion of the development apparatus and is collected.

Each of rinse apparatus 28f1 and 28g1 has central slits through which a liquid, typically ISOPAR G, flows onto a surface of a PC to remove excess toner. Excess toner and ISOPAR G flow through parallel channels (not illustrated) which empty into reservoirs 28f2 and 28g2. Each of 28f1 and 28g1 has a skive (not illustrated) therewith which removes excess toner and ISOPAR G.

Station 30 comprises blotter roller 30a which removes wet toner from the trailing platen end clamp (not illustrated), and air drying apparatus 30b which directs a stream of air at the PC passing thereover to dry the PC.

Station 32 comprises lower light erase apparatus 32a. Lower light erase apparatus 32a is positioned below the platen 22a when platen 22a passes station 32. Lower light erase apparatus 32a is typically a fluorescent lamp which is selectively turned on to equalize potentials across the PC.

Operation

Figures 4, 4B:
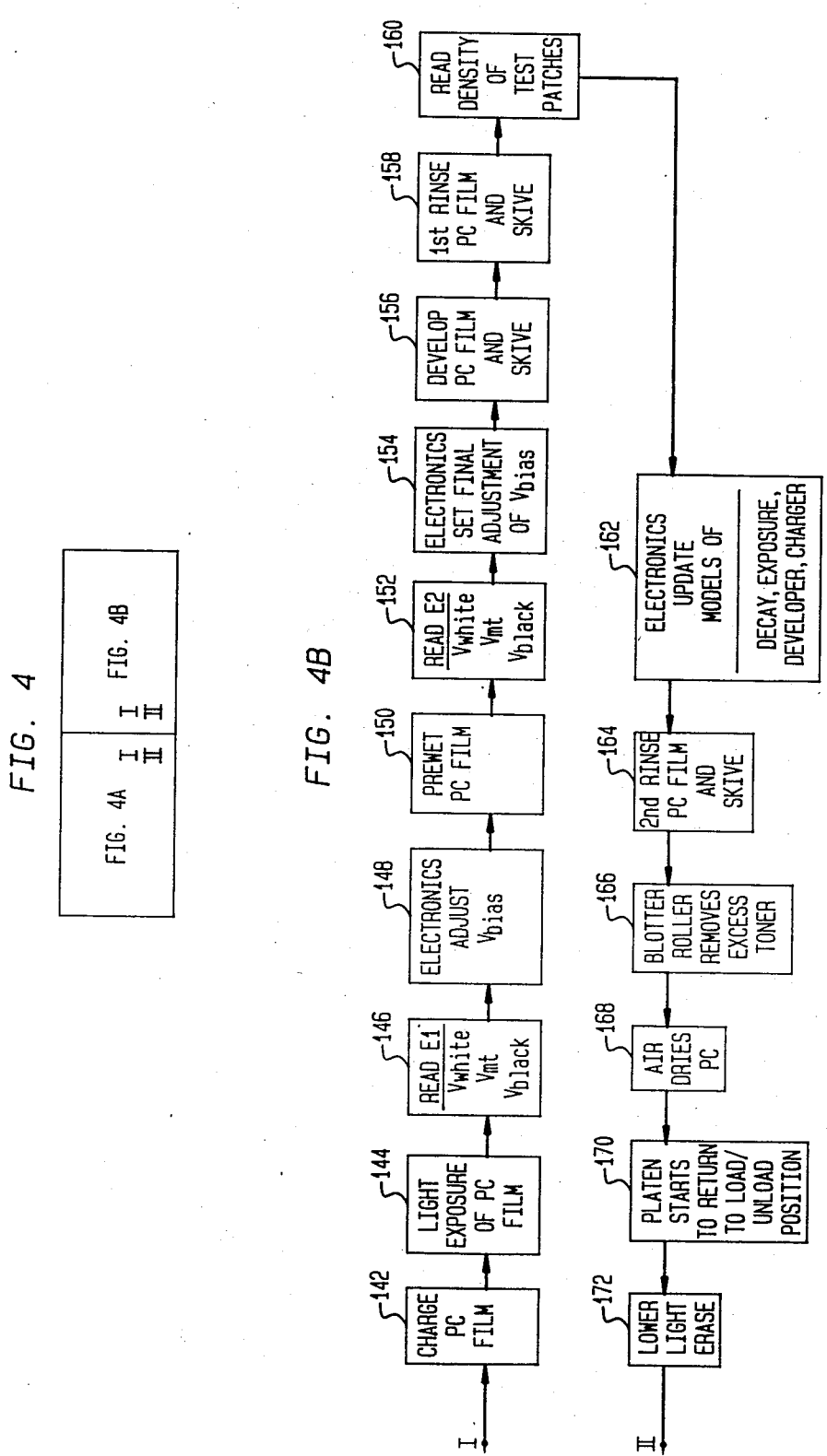
FIG. 4 is a diagram showing the proper alignment of the drawing sheets of FIGS. 4A and 4B.
FIGS. 4A and 4B collectively illustrate a flowchart in accordance with the present invention.
Figure 4A:
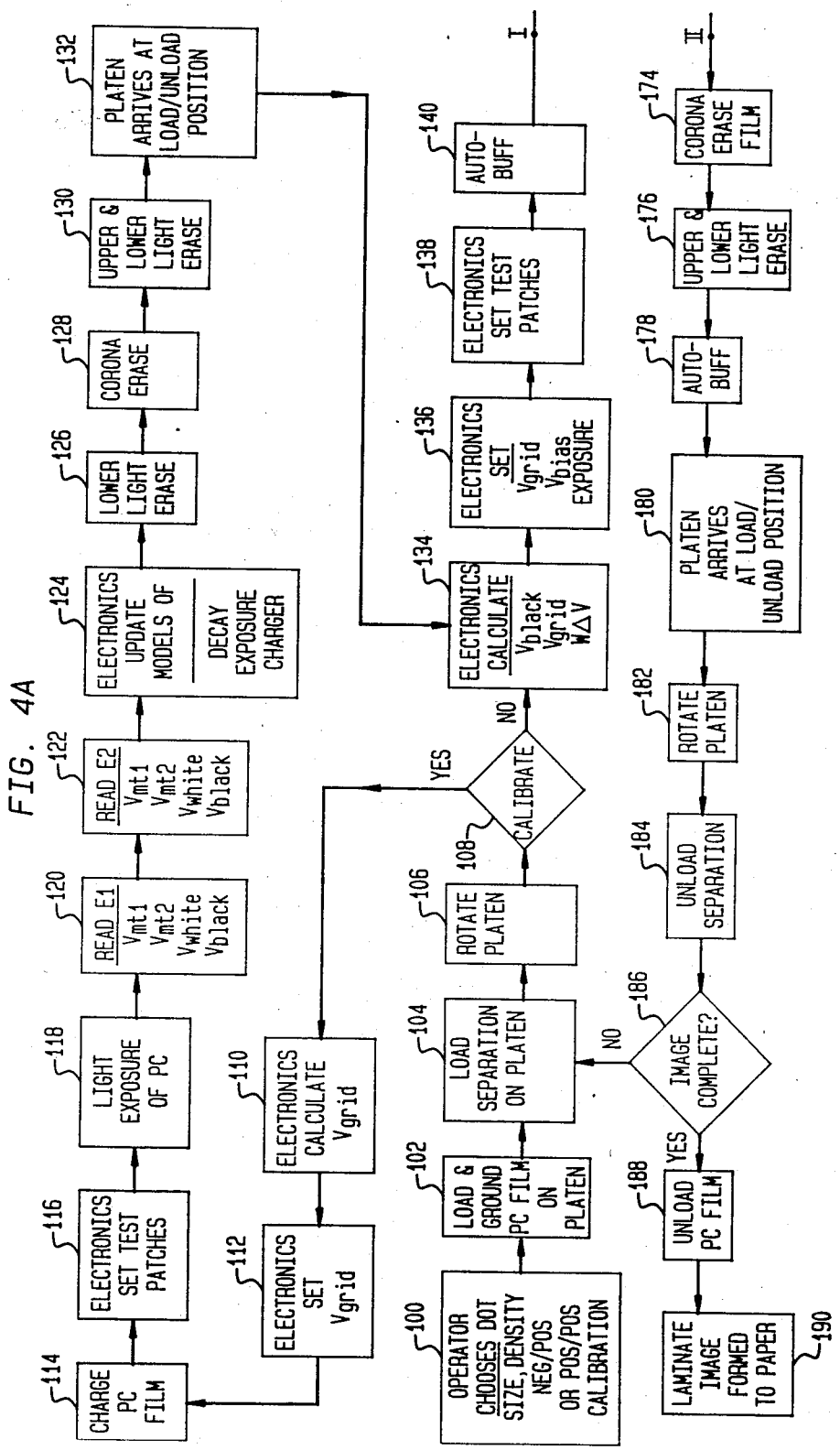

The operation of apparatus 10 is illustrated in the flowchart of FIGS. 4A and 4B which are connected together as illustrated in FIG. 4. An operator of apparatus 10 initially sets desired dot size, density, the election of starting with a positive or negative separation, and a decision to use a calibration run or not. From a review of a press sheet derived from separations which are to be used for a proof to be generated by apparatus 10, the operator estimates the dot gain or loss of dots on the press sheet versus dots on the separation. The dot sizes on the proof to be generated are set to be essentially equal to the dot sizes on the press sheet. For the purpose of this example, it is assumed that four negative color half-tone separations (black, magenta, cyan, and yellow) are being used and that observation of the press sheet reveals a dot gain (i.e.—the press proof has dots which are larger than those of the separations from which the press sheet was derived). The operator therefore enters the estimated dot sizes for each color, a customer desired density for each color, the use of negative separations, and the election to do an initial calibration run into operator control panel 36 of FIG. 1, as indicated in box 100.

The PC is first placed on platen 22a and grounded by clamps which electrically connect a conductive layer thereof to apparatus 10 as indicated in box 102. Lift arm 22c is activated and brought down to the front edge of the PC. The front edge of the PC is attached by a vacuum to lift arm 22c. Then lift arm 22c is returned to the position illustrated in FIG. 1. Typically, the black separation is first placed in a preselected portion of platen 22a as indicated in box 104 and then lift arm 22c is lowered. The end of the PC held by lift arm 22c is released and laid down on 22a. Platen 22a is now rotated 180 degrees as is indicated in box 106. The decision to use a calibrate run has been elected and therefore the YES path of box 108 is elected. Control electronics 600 calculate the grid voltage $V_{grid}$ of charging apparatus 24c as is illustrated in box 110. Since this is a first run a number in a memory table of 600 is used. Control electronics 600 then set the grid 24f of charger apparatus 24c to the selected potential as is indicated in box 112.

Platen 22a now starts to travel at a speed which is controlled by control electronics 600 from station 22 towards station 24. Autobuff apparatus 24a is lowered and does not contact the PC at this point and upper 24bu and lower 24bl light erase apparatus are turned off. A photoconductive layer of the PC starts to be charged to essentially $V_{grid}$ as it passes above charging apparatus 24c. As the PC completes its movement by 24c, a surface thereof is essentially uniformly charged to the potential $V_{grid}$ as is illustrated in box 114. Control electronics 600 now move filters on platen 22a so as to allow complete exposure of some test patch areas, to allow only partial exposure of others, and to not allow any exposure of still others as is illustrated in box 116. Platen 22a is now moved to station 26 and the PC film is exposed in areas that are not masked by the density on the black separation as illustrated in box 118. The exposed areas drop in potential while the masked areas stay close to $V_{grid}$. The charge on the PC continues to decay as it moves beyond station 26.

Prewetting apparatus 28a1 is deactivated during the calibration cycle as are the four development electrode-toner apparatus 28b1, 28c1, 28d1, and 28e1, the rinse apparatus 28f1 and 28g1, the air drying apparatus 32b, and blotter roller 30a.

As the PC passes electrometer 28h, voltage readings of the test patch area $V_{mt1}$(middle-tone voltage 1), $V_{mt2}$(middle-tone voltage 2), $V_{white}$(the voltage in completely exposed areas), and $V_{black}$ (the voltage in non-exposed areas) are taken as indicated in box 120. The PC passes the yellow development apparatus 28b1 and then passes electrometer 28j which measures the voltages of the same test patch areas as indicated in box 122. There is some drop in voltage between the two separated electrometers as the PC charge decays somewhat with time. The voltage readings at both electrometers are coupled to the control electronics 600.

Control electronics 600 now update mathematical models of voltage drop because of charge decay on the PC, of exposure, and of the charger as is illustrated in box 124. These models and the calculations performed will be discussed in further detail hereinbelow.

Platen 22 now changes direction and the PC now passes lower light erase apparatus 32a which is now turned on and tends to equalize potentials over all areas of the PC. This operation is illustrated in box 126. It then moves back to station 24 where it passes over charging apparatus 24c as is indicated in box 128. The sign of the potential applied to the grid 24f is reversed. This reverses the electrical field in the PC. The PC then passes by the upper 24bu and lower 24bl light erase apparatus which are now on and cause the PC to be discharged essentially back to the charge state it had when it was placed on platen 22a as is illustrated in box 130. This is known as corona erase which is described in more detail in U.S. patent application Ser. No. 839,009 filed Mar. 12, 1986, entitled METHOD AND APPARATUS UTILIZING CORONA ERASE FOR IMPROVING A MULTI-COLOR ELECTROPHOTO- GRAPHIC IMAGE, in the names of A. Buettner et al, and which is copending with the present application and in which there is a common assignee. The platen continues to move and arrives back at the load/unload position (station 22) as is illustrated in box 132. Control electronics 600 now calculate the voltages $V_{black}$, $V_{grid}$, and $W\Delta V$ as is illustrated in box 134, and set the exposure, and voltages $V_{grid}$ and $V_{bias}$ as is indicated in box 136, and set up the test areas on the side of the PC for a first image forming run using the black separation.

Platen 22a now moves from station 22 to station 24 and past the autobuff roller 24a, which is in a lower position and does not contact the PC. It then moves through charger apparatus 24c which places a uniform charge on the PC as is indicated in box 142. Platen 22a then arrives at station 26 at which the PC is exposed to light as is indicated in box 144. It then moves past electrometer 28h where readings of $V_{white}$, $V_{mt}$, and $V_{black}$ are taken in the test patch areas of the PC as is indicated in box 146. Control electronics 600 now adjust $V_{bias}$ as is indicated in box 148. The PC is then wet with ISOPAR G by prewetting apparatus 28a1 as is illustrated in box 150. Platen 22a then moves past electrometer 28j which reads $V_{white}$, $V_{mt}$, and $V_{black}$ as is indicated in box 152. Electrometer 28j is not used when the yellow toner is being developed but is used for the three other colors. Control electronics 600 now calculate and set a new value for $V_{bias}$ as is illustrated in box 154. The value for $V_{bias}$ set in box 148 is the value used when the yellow toner is being deposited on the PC.

The PC passes over the yellow, magenta, and cyan development electrode-toner apparatus 28b1, 28c1, and 28d1, which are deactivated as this time, and then to black development electrode-toner apparatus 28e1 which is activated. At 28e1 the PC receives black toner which is developed onto the PC, and excess toner is skived off the PC as is illustrated in box 156. The PC now passes first rinse apparatus 28f1 which rinses off excess toner and skives the PC as is illustrated in box 158. The PC now passes densitometer 28k which reads the densities of the test patch areas of the PC as is illustrated in box 160. These readings are coupled to control electronics 600. Control electronics 600 now update the models to the decay, exposure, developer and charger as is illustrated in box 162.

The PC now passes over second rinse apparatus 28g1 which performs the same function as first rinse apparatus 28f1. This operation is illustrated in box 164.

The PC now passes over blotter roller 30a and then air drying apparatus 30b as is illustrated in boxes 166 and 168, respectively. Lower erase light 32a is off as platen 22 passes. After platen 22a reverses direction, as indicated in box 170, lower erase light 32a is turned on. Lower erase light 32a tends to equalize the potentials of all areas of the PC as is illustrated in box 172.

The PC now moves back to the charging apparatus 24c where the voltage on grid 24f is reversed in polarity so as to reverse the electrical field in the PC as is illustrated in box 174. The PC now moves between the upper 24bu and lower 24bl erase lights that are now turned on and cause the PC to be discharged to essentially the same state as existed at the time it was placed on platen 22a as is illustrated in box 176. Autobuff roller 24a is in a lowered position at this time and during a return of the PC is used only after the last color (in this case cyan) is placed on the PC as is illustrated in box 178.

Platen 22a now arrives back at its initial position as is illustrated in box 180. Platen 22a is then rotated 180 degrees as is illustrated in box 182. The black separation is then removed as is indicated in box 184. This operation of developing one color is known as a toning pass. Box 186 illustrates that the PC image is reviewed and that either another separation is to be added, as is illustrated in box 104, or the image on the PC is complete and the PC is unloaded as is illustrated in box 188.

For the operation described up to this point only the black toner is on the PC and therefore a second separation, typically the yellow separation, is loaded on platen 22a. The flowchart process illustrated is repeated but the portion of the flowchart which is used to initially calibrate is omitted. Autobuff roller 24a is in a raised position and is used before the PC enters the charging apparatus 24 for all but the first toning pass, as is illustrated in box 140. The magenta and cyan separations are subsequently used in the same manner until the image is fully formed on the PC.

After all the four colors have been formed on the PC, it is then laminated to paper as is indicated in box 190. The lamination occurs in one illustrative embodiment at 40 psi at a temperature of 105 degrees C. for approximately two minutes. Next, the PC and paper are separated such that the thermoplastic top layer portion of the PC which contains the desired image is separated from the rest of the PC.

Figure 5A:
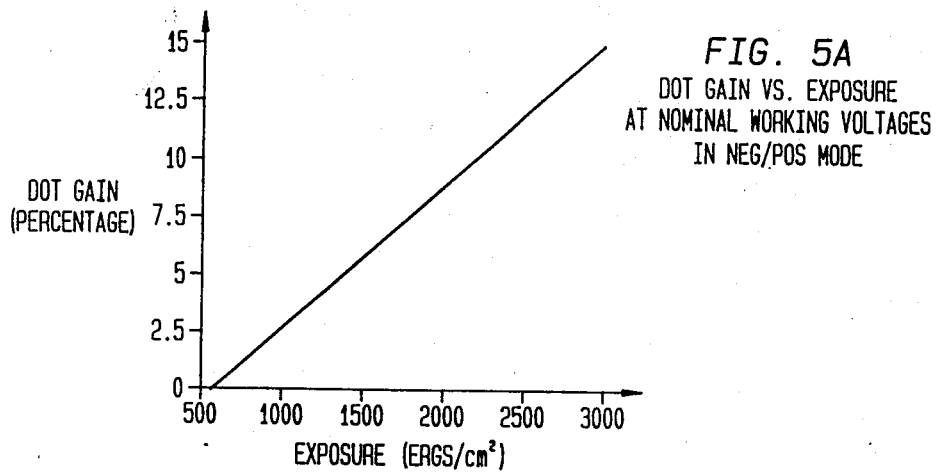
FIGS. 5A, 5B, and 5C graphically illustrate a change in dot size versus exposure, a first working voltage, and a second working voltage, respectively.

Referring now to FIG. 5A, there is graphically illustrated dot gain (percentage) on the Y-axis versus exposure in ergs/cm$^2$ on the X-axis. The curve illustrated is essentially a straight line having a slope of approximately 0.0065. Graph 5A is obtained using negative separations and apparatus 10. The exposure is varied and the resulting dot gain is measured. When the exposure is doubled, from 1000 to 2000 ergs/cm$^2$, the dot gain increases by approximately 3.6 times from 2.5% to 9%.

Figure 5B:
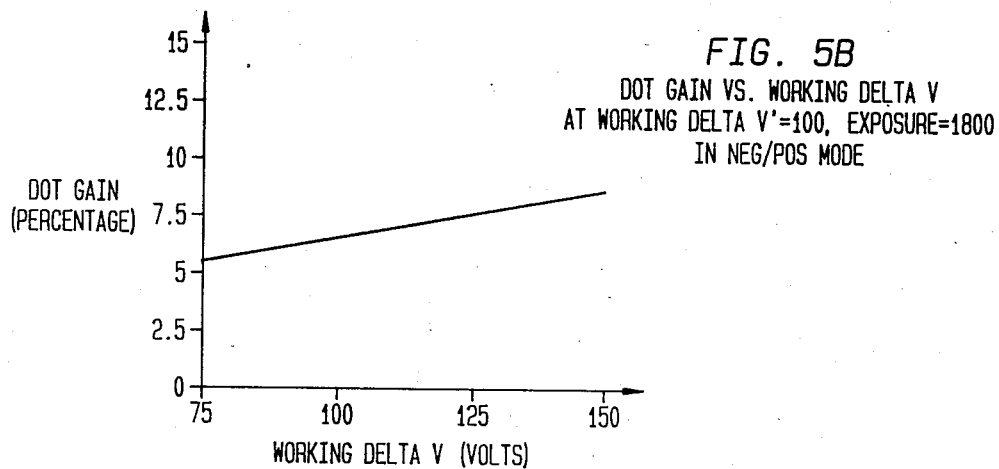

Referring now to FIG. 5B, there is graphically illustrated dot gain (percentage) versus Working $\Delta V$ (volts) (also known as W$\Delta$V or W delta V or Working Delta V). Working $\Delta V$ is the magnitude of the difference between the voltage of the areas to be toned on the PC at the start of development and the voltage ($V_{bias}$) applied to the rollers of the development-toner station. The curve is essentially a straight line having a slope of approximately 0.039. When the voltage on the X-axis is doubled from 75 to 150 volts, the dot gain increases by approximately 1.6 times from 5.5 to 8.5%.

Figure 5C:
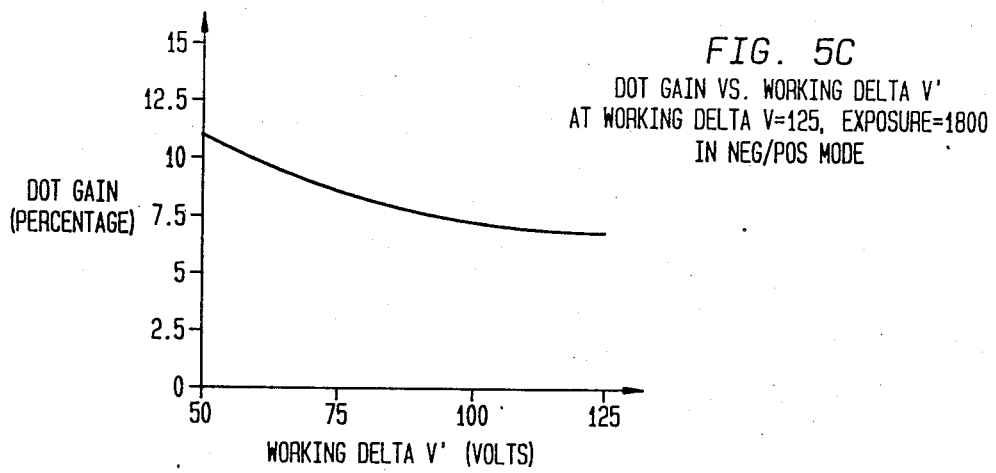
Figure 5D:
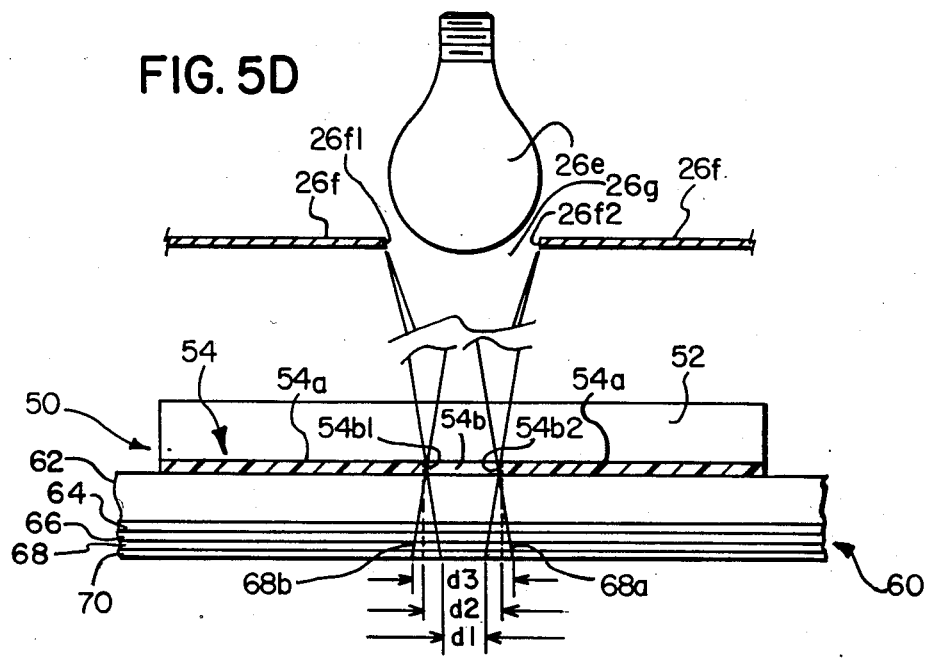
FIG. 5D illustrates a light source illuminating a photoconductive film through a separation.

Referring now to FIG. 5C, there is graphically illustrated dot gain (percentage) versus Working $\Delta V'$ (volts) (also known as W$\Delta$V', or W delta V' or Working Delta V'). Working $\Delta V'$ is the magnitude of the difference between the voltage at the start of development of areas not toned on the PC and the voltage $V_{bias}$. As the X-axis voltage drops in half from 100 to 50 volts, the dot gain increases by approximately 1.5 times from 7.5 to 11%. The curve is not a straight line.

It is clear from the curves of FIGS. 5A, 5B, and 5C that by far the most critical factor in controlling dot gain in a negative to positive (neg/pos) system is exposure.

When a separation is placed under the PC, the photoconductive layer of the PC is separated from the emulsion of the separation by the other layers of the PC. As illustrated in FIG. 5D, which is discussed hereinbelow, this separation distance allows for a penumbra to be exposed about a nominal dot area. The penumbra thus created has decreasing exposure as one moves outward toward the periphery of the dot. The decreasing exposure in the penumbra causes the voltage of the exposed dot to ramp up from a minimum in the most heavily exposed area of a dot, illustrated in FIG. 5E to a maximum value where no exposure occurred.

By controlling all these variables, the dot gain achieved in reproducing dots from separation negatives is varied. When an operator selects a dot size for a given color, (i.e. enters same into control panel 36) control electronics 600 readjusts all appropriate interactive parameters such that apparatus 10 generates the requested dot size essentially independent of density. A visual display of all information entered into control panel 36 appears on display device 38.

Referring now to FIG. 5D, there is illustrated a portion of the exposure station 26 of FIGS. 1 and 3 which comprises light source 26e, mask 26f having edges 26f1 and 26f2 which define an aperture 26g. Aperture 26g controls the angular spread of light emitted by light source 26e. Light source 26e is illustrated illuminating a PC 60 through a separation 50.

Separation 50 includes a support layer 52 and a emulsion layer 54 which is illustrated as having an opaque area 54a and a transparent area 54b. Opaque area 54a does not allow light to be transmitted therethrough while transparent area 54b allows light to be transmitted therethrough. The cross-sectional dimension d2 of area 54b corresponds to the nominal size of a dot which is to be formed on PC 60 in a portion thereof which is spaced directly below area 54b. PC 60 typically comprises a support layer 62, a conductive (ground) layer 64, a barrier layer 66, a photoconductive layer 68, and a thermoplastic layer 70. Typically, PC includes barrier layer 66 such that it is useful independent of whether a separation used is positive or negative. Examples of PCs which can be used with apparatus 10 are described in U.S. Pat. No. 4,600,669, issued July 15, 1986, entitled "Electrophotographic Color Proofing Element and Method for Using the Same". This patent has the same assignee as the present application.

Light emitted by 26e passes through layers 52 and 54b of separation 50 and then passes through layers 62, 64, and 66 of PC 60 and exposes a portion of photoconductive layer 68 of PC 60 which is located below area 54b and which has a cross-sectional size denoted as d3. The dimension at d3 is greater than the nominal dot size which is d2. Light passing edge 26f1 passes by a right-hand edge 52b2 of area 54b and exposes a right-hand outer edge 68a of layer 68. Light passing edge 26f2 passes by a left-hand edge 54b1 of area 54b and exposes a left-hand outer edge 68b of layer 68. The area of maximum exposure of layer 68 is essentially the central region below light source 26e and is denoted as having a dimension of d1. The dimension of d1 is less than that of d2. The region of exposure between d1 and d3 is defined as a penumbra. Most of the penumbra can be developed by selecting the combination of $V_{grid}$ and $V_{bias}$ such that a dot is formed having a size which is somewhere between approximately d1 and approximately d3. If the dot formed has a size which is close to d1 then the dot is said to have been sharpened (i.e., reduced in size below the nominal size d2). If the dot has a size greater than d2, then it is said to have gained size or that there has been dot gain.

Figure 5E:
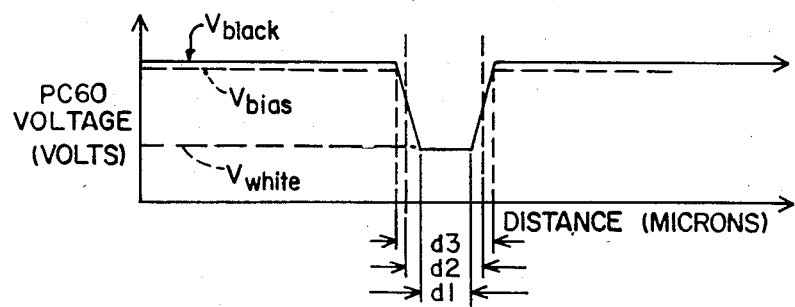
FIG. 5E graphically illustrates a photoconductive film (PC) voltage versus position (distance) on the PC.

Referring now to FIG. 5E, there is graphically illustrated a voltage profile that results on PC 60 of FIG. 5D when illuminated by light source 26e through aperture 26g of mask 26f. This voltage characteristic assumes a fixed level of exposure. The graph illustrates PC 60 voltage levels on the Y-axis and distance across the PC on the X-axis. $V_{black}$ exists in the unexposed areas of PC 60 and $V_{white}$ exists in the most heavily exposed areas of PC 60. The level selected for $V_{bias}$ (the development electrode voltage) determines how much of the exposed distance d3 of PC 60 of FIG. 5D will actually be developed by the development-toner station of apparatus 10 and thus transformed into a dot on PC 60. Using apparatus 10 in a neg/pos mode, the exposed region of PC 60 of FIG. 5D, which has a cross-sectional size of d3, can be developed such that the resulting actual dot generated has a size of between d2 and close to d3.

Figure 5F:
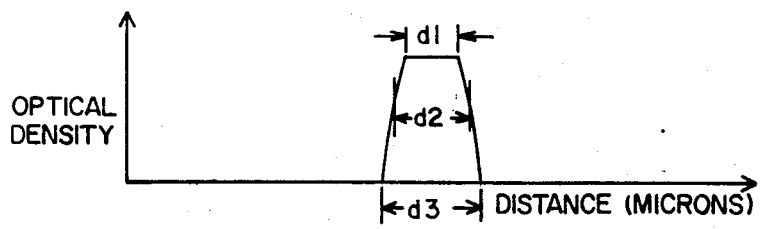
FIG. 5F graphically illustrates optical density of a dot versus distance.

Referring now to FIG. 5F, there is graphically illustrated a profile of a dot which is formed on PC 60 using the exposure, mask, and $V_{bias}$ level illustrated in FIG.'s 5D and 5E. The profile illustrated indicates that the effective dot size formed on PC 60 is close to a size d3 which is greater than the normal size d2 of the dot as same is defined in FIG. 5D. This represents an example of the dot gain which is achievable by apparatus 10.

Figure 5G:
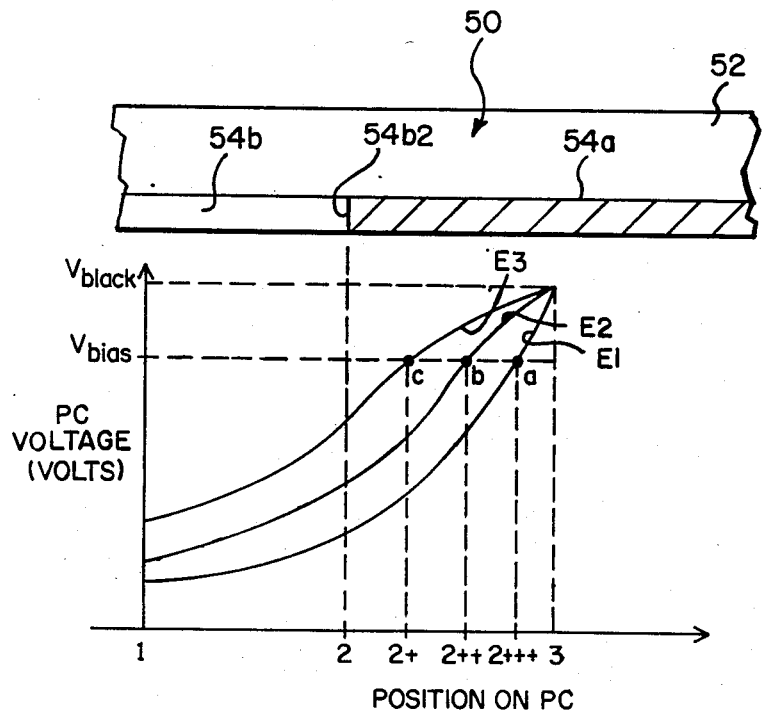
FIG. 5G graphically illustrates a photoconductive film (PC) voltage versus position (distance) on the PC.

Referring now to FIG. 5G, there is graphically illustrated the voltage on PC 60 of FIG. 5D in the penumbra surrounding a dot edge which corresponds to a dot formed using edge 54b2 of mask 54 of FIG. 5D. The graph illustrates PC 60 voltage levels on the Y-axis and the locations of one edge of a dot generated on the X-axis. A portion of mask 54 is illustrated above the graph to indicate the nominal edge of the dot to be formed as defined by edge 54b2 of mask 54 of FIG. 5D. Unlike the embodiment of FIG. 5E where the exposure is fixed, in FIG. 5G $V_{bias}$ is assumed constant and the exposure is varied from a level of E1 to E2 to E3, with E1 being the maximum exposure and E3 being the minimum exposure. The intersections of $V_{bias}$ with each of E1 through E3 are denoted as intersection nodes a, b and c, respectively which correspond to the actual location of one edge of a dot which is generated. Positions 1, 2, and 3 on the X-axis correspond to the nominal edge of dots having a diameter of d1, d2, and d3, respectively, and generated by apparatus 10 as illustrated in FIG. 5E. The X-axis location of intersection nodes a, b and c are illustrated as $2+$, $2++$, and $2+++$, respectively, where $3 > 2+++ > 2++ > 2+ > 2$. Thus, it is clear that with essentially fixed $V_{bias}$ and $V_{grid}$, increasing exposure E1 to E2 to E3 results in increased dot gain.

If one starts with a positive separation and uses apparatus 10 to form a positive proof, apparatus 10 allows dot loss (dot sharpening) to be created in the proof which essentially replicates the dot loss which results when positive separations are used to form press plates. In this case the nominal dot formed is smaller than the dot of the separation. The net result of addition of the dot loss generated by creating the printing plate and the dot gain generated by printing on paper may be a dot gain. Apparatus 10, when generating a proof from a positive separation, cannot generate a dot gain. One possible solution is the use of a transparent spacer between the paper and the thermoplastic layer of PC 60 which contains the image. This spacer is known to provide optical dot gain. One example of such a spacer is given in U.S. Pat. No. 4,262,071, issued Apr. 14, 1981. Another solution is to overlay the proof generated by apparatus 10 with a transparent sheet known as a "dot gain pad" which is described in a patent application U.S. Ser. No. 838,486, filed Mar. 11, 1986 entitled COLOR PROOFING METHOD AND ARTICLE, filed in the names of J. H. Ambro et al, which is copending with the present application and which has a common assignee. The dot gain pad effectively increases the visual density of the image. If for example, a positive separation and the particular paper used for a press sheet result in a press sheet having a positive dot gain of four percent (4%), then apparatus 10 can be set to generate a proof having a dot loss of minus three (−3%) percent. A dot gain pad which effectively introduces a dot gain of plus seven (+7%) percent is then placed over the proof. The net result is a proof created from a positive separation which has a dot gain of plus four (+4%) percent and which is calibrated to a press sheet derived from the same separations.

Control Electronics

A. Overview

Figure 6:
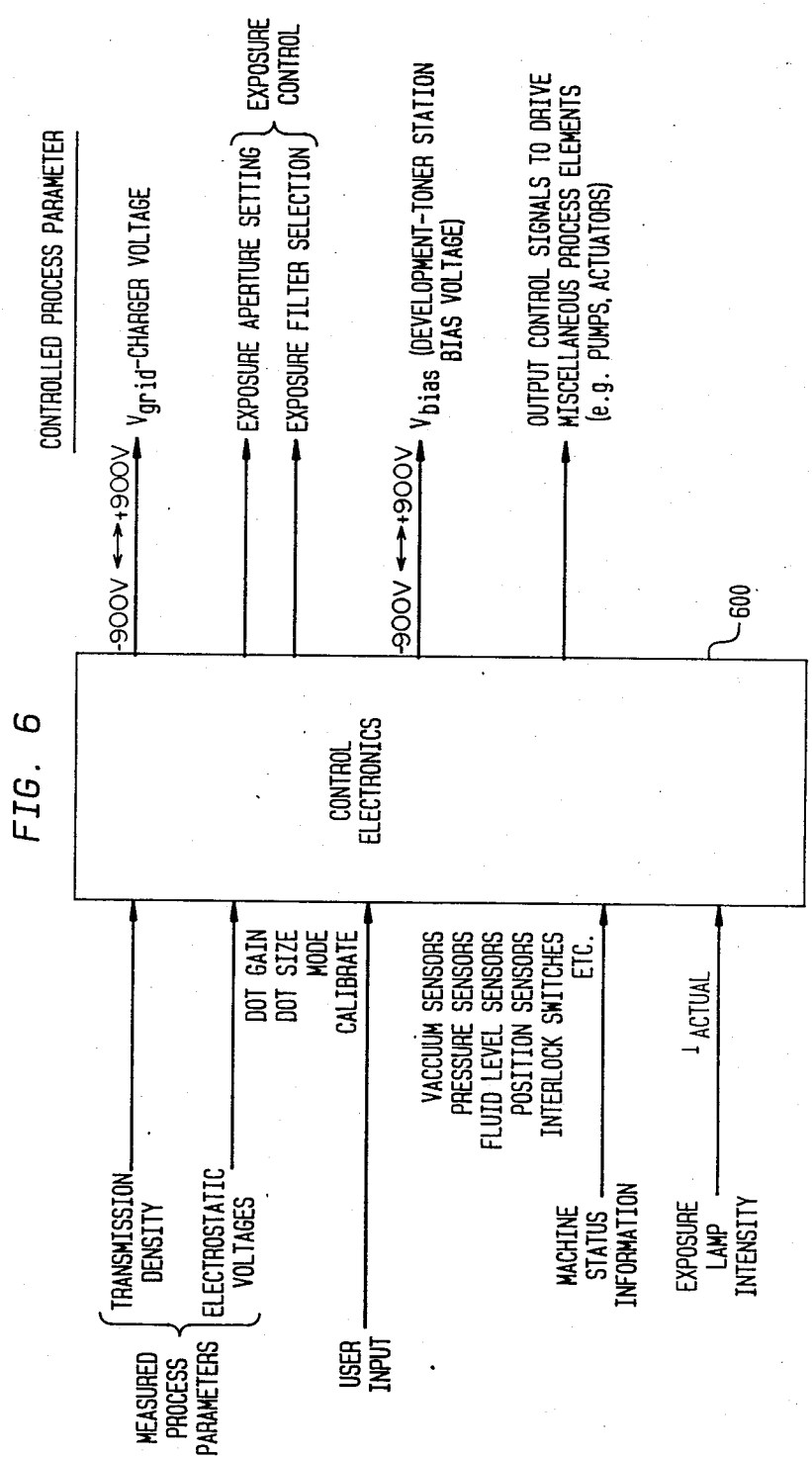
FIG. 6 is a diagram depicting the process controller and principal process input and output signals used in the inventive system.

FIG. 6 is a diagram depicting the process controller and principal process input and output signals used in the inventive system. As noted, the system can operate in two distinct modes: pos/pos mode wherein a positive separation is used to make a positive proof or alternatively in neg/pos mode wherein a negative separation is used to make a positive proof. Generally speaking, only the sign of any process control voltage ($V_{bias}$, $V_{grid}$, and the measured electrostatic film voltages) changes, for example, from negative to positive, whenever the mode changes, for example, from pos/pos to neg/pos mode. The magnitude of these voltages often remains the same. Completely exposed film test patches will be referred to as white and completely unexposed test patches will be referred to as black. To simplify the ensuing discussion, only the neg/pos mode will be specifically discussed. However, specific mention will be made whenever variations other than mere sign changes occur between modes.

As previously discussed, the user supplies the system, through control electronics 600, with four parameters: desired dot size (on an integer scale of 0 to +6), desired density (on an integer scale of −6 to 0 to 6), separation mode (i.e. pos/pos or neg/pos mode), and whether the system is to execute a calibration pass. Then, with this information, control electronics 600 automatically controls dot size and density by appropriately varying three controlled process parameters: the amount of light used to expose the photoconductive film (the "exposure"), the voltage applied to the charger grid (the "grid" voltage or $V_{grid}$) and the bias voltage ($V_{bias}$) applied to the particular development head that is used to tone the image during any toning pass. The magnitude of voltage $V_{grid}$ establishes the amount of charge that is initially placed onto the photoconductive film. The amount of toner to be deposited on the PC film is determined by the magnitude of the difference between the voltage of the areas to be toned on the PC at the start of development and the voltage ($V_{bias}$) applied to the roller electrodes of the development toner station. As discussed, control over $V_{grid}$ and $V_{bias}$ is effectuated by processing measurements of a number of process parameters: the transmission density of the test patches on the toned image, and the electrostatic voltages of exposed portions ($V_{white}$ and $V_{midtone}$) and of an unexposed portion ($V_{black}$) of the film test patches at two specific locations. As noted, these locations are situated directly after the charging station and directly after the yellow development head. The densitometer measures the transmission density of each test patch during each toning process.

Depending upon the desired dot size and measured process variable, control electronics 600 sets the magnitude of $V_{grid}$ to any necessary value up to +900 volts for neg/pos mode (−900 volts for pos/pos mode), as determined by the toning control process which is discussed in detail below. Similarly, the control electronics sets $V_{bias}$ to any necessary value up to +900 volts for neg/pos mode (−900 volts for pos/pos mode), also as determined by the toning control process.

In addition, control electronics 600 provides exposure control spanning two orders of magnitude through a combination of coarse and fine exposure adjustments. Specifically, control electronics 600 determines the necessary amount of light energy that must strike the film. Once this amount has been determined, the control system first selects an appropriate neutral density filter combination. There are two separate neutral density filters (a filter with a transmission density of 0.7 and another filter with a transmission density of 1.4) resulting in four possible combinations: no filters, either one of the filters or both filters. Thereafter, the system slides the appropriate filter(s) into the light path within the lamp house. Simultaneously therewith, the system monitors the exposure lamp intensity, Iactual, and, in response thereto, also regulates the opening of the exposure aperture by appropriately moving shutter 26a (see FIG. 3), as described in detail below. As noted, the shutter can open or close in very fine increments, typically on the order of as little as 5 ten-thousandths of an inch (approximately 0.013 mm). The aperture is shaped to correct for losses in light intensity that occur at the side of the aperture.

In addition, apart from controlling the process variables, exposure, $V_{grid}$ and $V_{bias}$, control electronics 600 also assures that all components of the proofing system are operated in their proper sequence. To do so, control electronics 600 receives signals from various process transistors, e.g., position sensors and interlock switches, as input and, in response thereto and to the control program, provides various output control signals to operate various actuators, pumps, solenoid and pneumatic valves and the like in their appropriate sequence. Moreover, the control electronics also provides a supervisory capability by constantly monitoring various machine status indicators to detect abnormal conditions (excessive pressures, low fluid levels, vacuum loss, interlock opened and the like) and change system operation accordingly.

B. Constituent Hardware

Figure 7C:
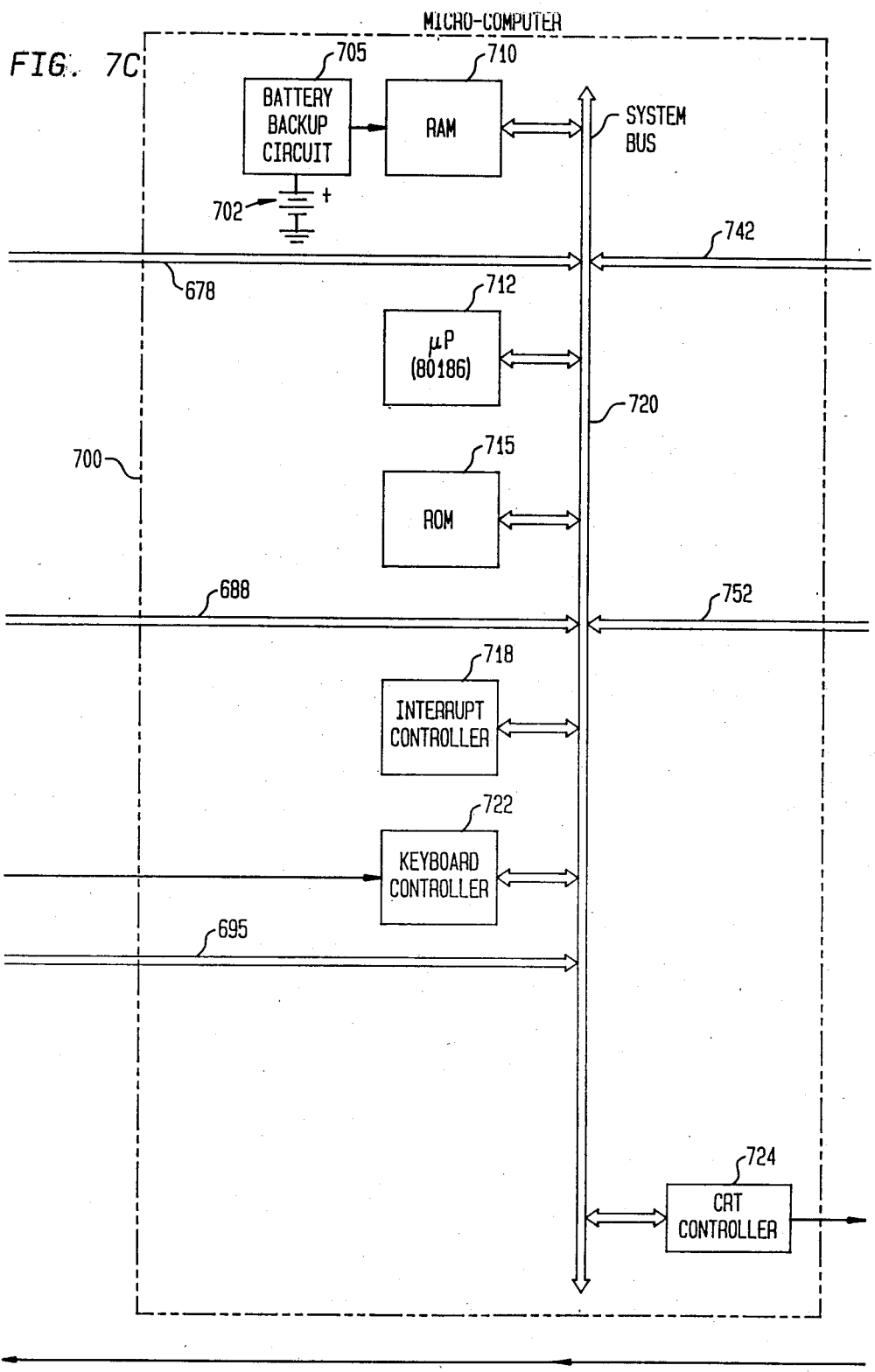
Figure 7D:
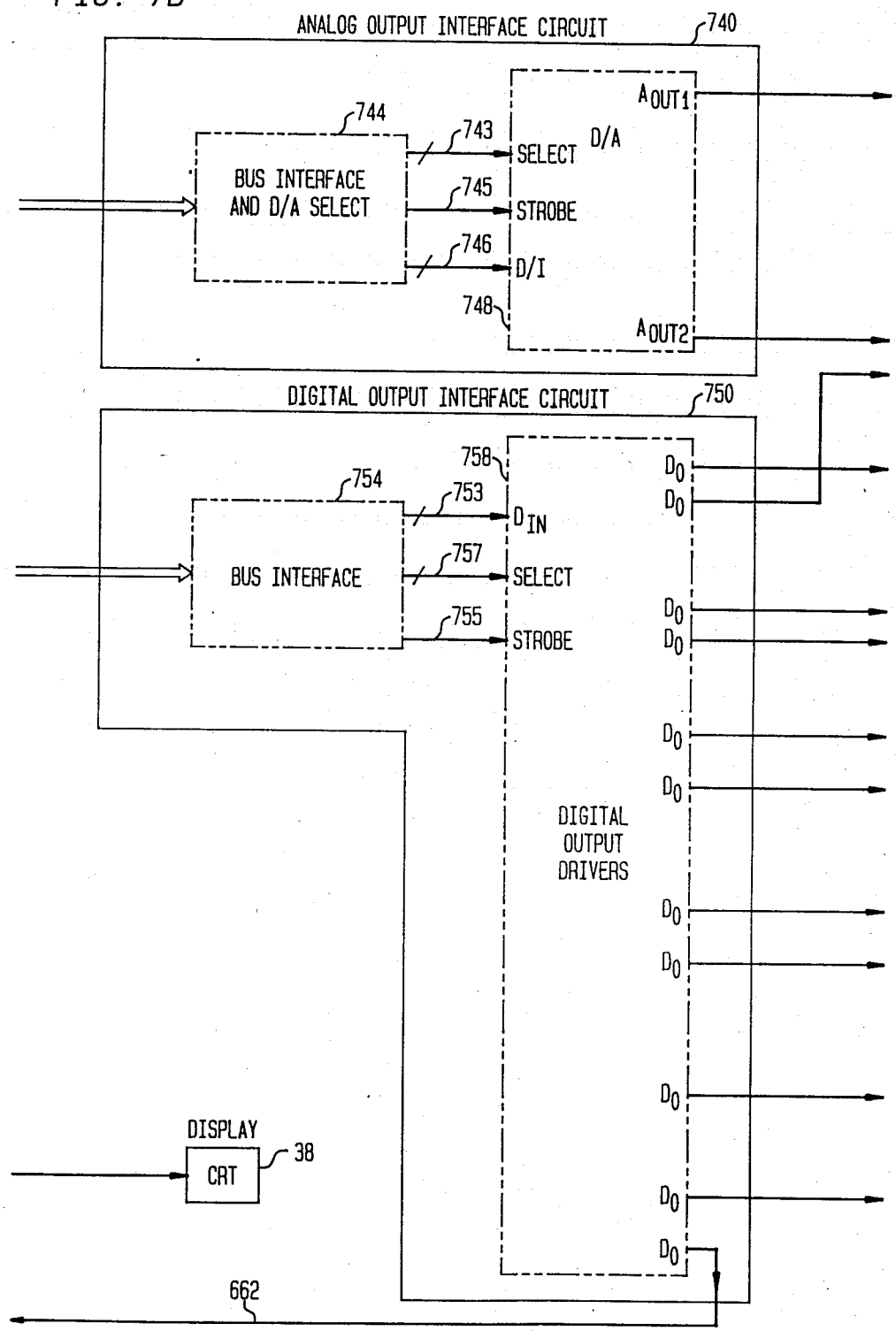
Figure 7E:
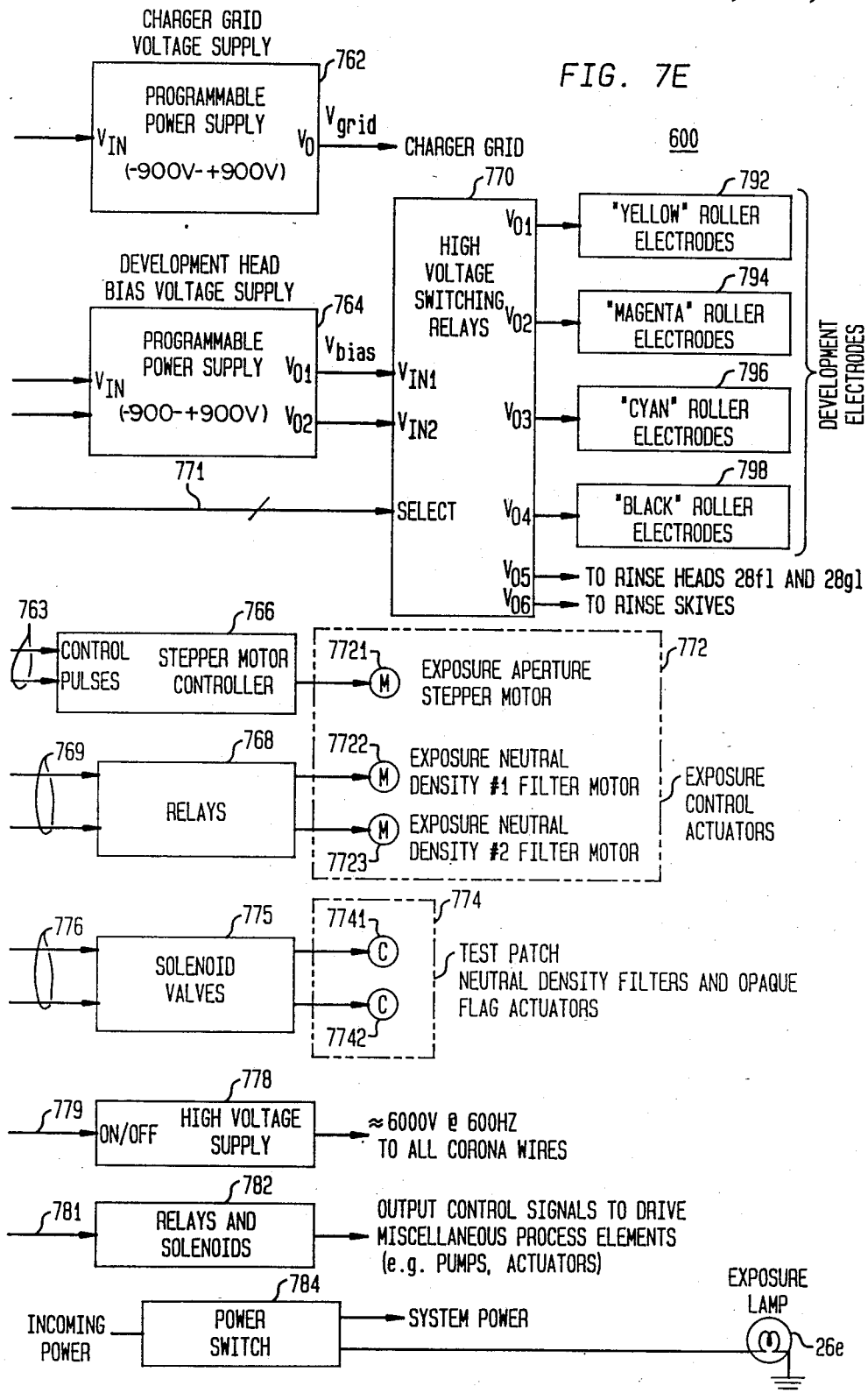

A block diagram of control electronics 600 is shown in FIGS. 7A-7E, with the proper alignment of the drawing sheets for these figures shown in FIG. 7.

As shown, the heart of control electronics 600 is micro-computer system 700 which accepts analog and digital process inputs and provides analog and digital process control output signals. The control algorithm is implemented as a program which is stored within and executed by the micro-computer system. Analog process inputs include the film voltages, $V_{black}$, $V_{white}$ and $V_{midtone}$, as measured by electrometers 28h and 28j, the actual exposure lamp intensity, Iactual, as measured by exposure intensity monitor 26c and the output signals produced by densitometer 28k. Digital process inputs include the position of both exposure neutral density filters, various machine status signals, and user input data (i.e. dot size, density, mode, calibration pass desired) provided through keyboard 640 located on operator control panel 36 (see FIG. 1). The analog process control output signals include the $V_{grid}$ voltage produced by programmable power supply 762 and the $V_{bias}$ voltage produced by programmable power supply 764. Certain digital process control output signals are applied from the micro-processor system, through stepper motor controller 766 and relays 768, to operate exposure control actuators 772 to provide the desired exposure setting. Other digital process output signals are applied through solenoid valves 775 to operate test patch neutral density filter and opaque flag actuators 774. Lastly, still other digital output process signals are used to activate corona high voltage supply 778; are applied through densitometer lamp driver 660, to activate densitometer lamp 661; and are applied through miscellaneous relays and solenoids 782 to actuate various system components (e.g. pumps, solenoids, and the like) to ensure proper system sequencing.

In particular, micro-computer system 700 is implemented using a standard 16-bit micro-processor chip 172, illustratively a model 80186 micro-processor manufactured by the Intel Corporation. The micro-processor itself and its supporting circuitry are all inter-connected through standard system bus 720.

The supporting circuitry initially includes random access memory (RAM) 710, read only memory (ROM) 715, interrupt controller 718, keyboard controller 722, and cathode ray tube (CRT) controller 724. ROM 715 stores the control program which includes executable code as well as various tables of constants. By contrast, RAM 710 stores measurement data and updated table values. Because any loss of this measurement data would be detrimental to proper system operation, RAM 710 is connected to battery backup circuit 705 which, in the event of a power failure, preserves the contents of the RAM using battery 702. Interrupt controller 718 monitors various conditions occurring within the micro-processor system itself, e.g. requests for input/output transfers, or conditions occurring within the entire system, e.g. a power-up or the expiration of time interval governed by an external system timer—such as a watchdog timer (not shown but well-known)—and in response thereto causes the micro-processor to interrupt its normal program execution to appropriately respond to these conditions. The interrupt controller assures that all interrupt requests are expeditiously handled but nonetheless prioritizes interrupt requests such that the highest priority interrupt is attended to first. User input (desired dot size, density, mode and calibration pass desired) is provided through keyboard 640. The output of the keyboard, illustratively eight bit parallel, is routed via leads 643 to keyboard controller 722. Keyboard controller 722 is periodically polled by microprocessor 712 to determine if there is any recent user input. If this input exists, keyboard controller 722 applies it, at the appropriate interval, to bus 720 which, in turn, routes it to micro-processor 712 for processing. Output information is provided to the user through display 38, which is illustratively a CRT display. At the appropriate times determined by the program stored within ROM 715, CRT controller 724 accepts data from system bus 720 and converts it into raster scan format for display on display 38. Such a bus based micro-processor system is well-known in the art and is commercially available from many sources, e.g. the MDS system produced by the Intel Corporation.

In addition, micro-processor system 700 contains suitable conversion circuitry to allow it to interface to the controlled system. For example, analog input interface circuits 670 and 690 contain suitable multiplexed analog/digital (A/D) converters which, under control of the program stored within ROM 715, sample and digitize each measured analog process signal (film voltages, actual exposure lamp intensity value and densitometer readings) and apply the resulting digital value through busses 678 and 688 to system bus 720 for subsequent processing by the micro-computer system. Analog output interface circuit 740, connected to bus 742, accepts digital data, under program control via bus 742, from the micro-computer system and converts that data using suitable digital/analog (D/A) converters to analog form. Each analog output is a scaled ±10 volt signal. As shown, one such scaled signal is applied as input to programmable power supply 762 to produce $V_{grid}$, with the input voltage range of ±9 volts corresponding to an output grid voltage range of ±900 volts. The other scaled analog signal is applied as input to programmable power supply 764 to produce $V_{bias}$, with the input voltage range of ±9 volts corresponding to an output bias voltage range of ±900 volts.

Digital input/output to the micro-processor system is provided through digitial input interface circuit 680 and digital output interface circuit 750, which are respectively connected through busses 688 and 752 to system bus 720. As instructed by the program stored within ROM 715, digital input interface circuit 680 latches the status of various digital input signals and provides the micro-processor system with this input information for subsequent processing. Also the micro-computer system, as determined by the control program, applies data over bus 752 to digital output interface circuit 750 which, in turn, sets any digital output bit to a desired state in order to control a driver and thereby effectuate a desired system function (open the exposure aperture, move an exposure neutral density filter into position, turn off the corona supply, start a pump and the like).

Now, with this overall architecture in mind, the discussion will now address the specific input/output process connections between the proofing system and micro-processor system 700.

As noted, film voltages $V_{black}$, $V_{white}$, and $V_{midtone}$ occurring at each of two locations, are measured by electrostatic voltmeters 610 which includes electrostatic voltmeter 28h and electrostatic voltmeter 28j. Electrostatic voltmeter 28h produces voltage measurements $V_{black1}$, $V_{white1}$ and $V_{midtone1}$; while electrostatic voltmeter 28j produces voltage measurements $V_{black2}$, $V_{white2}$ and $V_{midtone2}$. These measured voltages are applied through leads 613 to appropriate inputs, AIN1 and AIN2, of A/D 672 located within analog input interface circuit 670. As noted, exposure lamp intensity monitor 26c (see FIG. 1) is located in the plenum and situated immediately below the lamp housing, and is used to measure the actual output of exposure lamp 26e. This output can vary due, for example, to drift in the output of the lamp itself, changes in humidity, or dust accumulating on the mirrors located within the lamp house. In any event, photocell 622, located within the lamp intensity monitor, produces a voltage proportional to the intensity of the light produced by the exposure lamp. This voltage is applied to amplifier 624 which appropriately amplifies and scales this voltage to that required as input by A/D converter 672. This scaled voltage, corresponding to Iactual, is applied over lead 626 to another analog input, AIN3, to A/D 672. As shown, A/D 672 contains a single A/D converter which is multiplexed between its input analog signals. In response to suitable instructions (including appropriate address information) appearing on bus 678 and emanating from micro-processor system 700, bus interface and A/D select circuit 674 generate suitable control signals to A/D 672. For example, circuit 674 applies suitable signals over lead 673 to select the desired input analog signal that is to be converted. Once this has occurred, circuit 674 applies a suitable signal to lead 675 to initiate an analog-to-digital conversion. Once the conversion has been completed, the digital results (digital output-D/O) are applied in parallel over leads 671 to circuit 674 which, in turn, supplies these results, with a suitable interrupt signal over bus 678, to micro-processor system 700.

Digital transducers 630 provide digital information regarding the position of both exposure neutral density filters and various status information. In particular, two switches 632 are used to detect the position of each exposure filter. These switches include a "home" switch which detects whether the filter is in its "home" position, i.e. in the light path, and an "end of travel" switch which detects whether the filter is out of the light path. The output of these switches are applied to suitable inputs, DIN, of input interface circuit 682. This circuit interprets a closed switch condition as one digital state (e.g. a logical "1") and an open switch condition as the other digital state (e.g. a logical "0"). The outputs of other digital transducers, collectively referred to as miscellaneous digital inputs 634, are applied to corresponding inputs of input interface circuit 682. Digital inputs 634 include digital signals produced by an optical position transducer which is physically connected to the exposure aperture and which produces a signal when the shutter has reached either its fully open or fully closed position. Inputs 634 also includes digital signals produced by various limit switches which are located throughout the proofing system and are used, for example, to detect excessive pressures, travel limits, vacuum losses, interlock violations, low fluid levels and the like. To obtain digital input data, micro-processor system 700 applies a suitable instruction (including necessary address information) to bus 688. Upon receipt of this instruction, bus interface 684 applies suitable address signals, over leads 687, to select the desired digital inputs. Thereafter, bus interface 684 applies a strobe pulse, over lead 685, to input interface circuit 682. This pulse causes the input interface circuit to latch the digital input data for the particular addressed digital input(s) and then apply the resulting digital data (D/O), over leads 683, to bus interface 684 which, in turn, applies this digital information to the micro-processor, via bus 688, for subsequent processing.

Transmission density, Dtrans, is determined using three color densitometer 28k situated after black toning station 28e1 (see FIG. 1). This densitometer includes three separate photodetectors, each of which detects the transmission density for a particular color of the toned image, i.e. cyan, magenta, and yellow. Specifically, to detect transmission density, micro-computer system 700 energizes densitometer lamp 661 by applying a suitable digital output signal to densitometer lamp driver 660, via digital output interface circuit 750—which will be discussed shortly—and lead 662. The densitometer lamp is situated slightly above the film path and shines light through the film to densitometer 28k situated immediately below. In operation, densitometer lamp 661 is energized by the micro-computer shortly after power up and is left on continuously thereafter during machine operation to stabilize the operating characteristics of the lamp. Once the test patch is in proper position, the micro-computer selects one of photo-detectors 6531, 6532 or 6533 to measure the light transmitted through the test patch. Specifically, if the test patch has been toned with black or magenta, green photodetector 6532 is selected; alternatively, if the test patch has been toned with cyan or yellow, then red photodetector 6531 or blue photodetector 6533 is selected, respectively. The output voltages produced by each photo-detector are then amplified and appropriately scaled by amplifier 6551 for photo-detector 6531, amplifier 6552 for photo-detector 6532 and amplifier 6553 for photo-detector 6533. The scaled outputs from these three amplifiers are routed over leads 657 to respective analog inputs of analog interface circuit 690 for subsequent digitization as instructed by micro-computer system 700.

On the output side from micro-computer system 700, analog output interface circuit 740 provides two scaled ±10 volt analog output voltages, one of which is applied as input to programmable power supply 762 which produces $V_{grid}$ and the other is provided as input to programmable power supply 764 which produces $V_{bias}$. Analog output interface circuit 740 contains D/A circuit 748, which contains a number of separate D/A converters. Upon receipt of an appropriate instruction (with suitable accompanying address information) over bus 742 from micro-computer system 700, bus interface and D/A select circuit 744 applies appropriate signals to leads 743 to select the appropriate D/A converter. Thereafter, digital data is applied via leads 746 to the selected D/A converter followed by a strobe signal over lead 745 to latch this data into the input register of the selected converter. The converter then performs a digital-to-analog conversion and applies the resulting +10 volt scaled analog signal to the appropriate analog output, AOUT. Specifically, analog output signals AOUT1 and AOUT2 provide the control voltage for $V_{grid}$ programmable power supply 762 and $V_{bias}$ programmable power supply 764, respectively. The high voltage produced by supply 764, via output $V_{O1}$, is routed through high voltage switching relays 770 which, in response to a suitable select signal applied as input thereto, routes the $V_{bias}$ voltage to the roller electrodes at a desired one of the four development-toner stations depending upon which color will be currently toned onto the film. Relays 770 have four separate high voltage outputs, $V_{O1}$, $V_{O2}$, $V_{O3}$ and $V_{O4}$ which are connected to yellow roller electrodes 792 located within development-toner station 28b1 (see FIG. 1), magenta roller electrodes 794 located within development-toner station 28c1, cyan roller electrodes 796 located within development-toner station 28d1 and black roller electrodes 798 located within development-toner station 28e1, respectively. The select signals applied to relays 770, via leads 771, are produced by digital output interface circuit 750 in response to suitable output data from micro-computer system 700.

In addition, programmable supply 764 provides a second output voltage, typically 1000 volts, which is applied, via output $V_{O2}$, to relays 770. Micro-computer system 700 applies a select signal via leads 771 to relays 770 to apply this high voltage as output voltage $V_{O5}$ to rinse heads 28f1 and 28g1 (see FIG. 1) as the platen passes over the rinse heads in order to clean the film, as previously described herein. Micro-computer 700 turns this high voltage on by applying a suitable digital output as input to supply 764. Furthermore, relays 770, as instructed by the micro-computer system, applies voltage $V_{bias}$, as output voltage $V_{O6}$ to the rinse skives also to clean the film, as discussed above.

As noted, digital output interface circuit 750 produces digital output signals which are, in turn, applied through suitable relays, solenoids and controllers to actuate various system functions. Specifically, in response to a suitable instruction (with accompanying address and data information) appearing over bus 752 from micro-computer system 700, bus interface 754 applies the data over leads 757 and thereafter selects the appropriate digital output driver(s) by applying suitable signals to leads 757. Thereafter, bus interface 754 applies a signal over lead 755 to strobe the data into the input of the selected drivers within digital output drivers 758. The digital outputs (DO) of these drivers immediately change state to match the applied data.

Exposure control is effectuated through exposure control actuators 772. These actuators comprise three separate motors 7721, 7722 and 7723. Motor 7721 is a stepper motor that has a shaft that incrementally rotates in one direction or another depending upon the sequence of 24 volt pulses produced by stepper motor controller 766. The shaft is attached through a linkage, as previously described, to shutter 26a (see FIGS. 1 and 3) which opens and closes the exposure aperture. Each incremental movement of the shutter is produced through the voltages appearing at two separate digital outputs from drivers 758 and applied through leads 763 to stepper motor controller 766. Motors 7722 and 7723, which are also bi-directional, appropriately position both exposure neutral density filters either fully in or fully out of the light path of exposure lamp 26e, as required by the control program. These two motors are driven by appropriate output bits produced by drivers 758 and applied over leads 769 to relays 768.

During the toning process and as required by the control program, either one or both of two test patch neutral density filters and/or a test patch opaque flag is appropriately moved into a desired position, i.e. between the film test patches and the exposure lamp, by pneumatic actuators 774, specifically two pneumatic cylinders 7741 and 7742. These cylinders are controlled by electrically actuated pneumatic valves 775. These valves are activated by appropriate digital signals appearing over leads 776 from digital output drivers 758 and originating as digital output data within micro-computer system 700.

A separate digital output bit from digital output drivers 758 is used to programmably activate high voltage supply 778. This supply provides an approximately 6000 volt, current controlled 600 Hz waveform that is applied to both corona electrodes 24e1 and 24e2 located in each of the six U-channels situated in charging apparatus 24c (see FIG. 2). This voltage is sufficient to ionize surrounding air and thereby generate a field of charged particles, all as previously discussed. In a similar fashion, other digital output bits from drivers 758 are applied over leads 781, through relays and solenoids 782, to sequentially activate a variety of system components, such as pumps, motors, valves and the like in order to ensure proper sequential operation of the entire proofing system.

Whenever power is applied to the proofing system through power switch 784, exposure lamp 26e is on. Continuous lamp operation advantageously stabilizes the operating characteristics of the lamp and lengthens its service life.

Control Software

Now having concluded the discussion of the hardware of the inventive proofing system, the discussion will now center on the software used to control the system.

A. Overview

In essence, as noted above, the control program, and particularly the algorithm used therein, relies on modelling each of four electro-photographic processes that occur within the inventive system: charging, exposure, film voltage decay and developing. To yield highly accurate performance, the control algorithm has two basic phases: calibration and toning. During the calibration phase, no toning occurs. However, the system obtains initial film voltage measurements and estimates certain parameters indicative of the performance of the charging, exposure and decay processes. The calibration phase—which consists of only one pass during which no toning occurs—produces a set of parameter values for use during the subsequent toning phase(s). The calibration phase must be run at least once before the toning phase begins in order for the system to establish a set of valid initial conditions. Now, once the calibration phase is completed, the toning phase can begin. During each subsequent toning pass, the micro-computer system first uses the models to predict the performance of the actual electro-photographic processes that will subsequently occur in the proofing system and then produces values of the controlled process parameters (the voltages $V_{grid}$ and $V_{bias}$, and the exposure settings) using user input and updated values from a previous pass in order to correctly set the actual control parameters to be applied to the charger, exposure and development-toner stations. Thereafter, actual process data (transmission densities and film voltages under conditions of varying exposure) occurring during that pass are measured. Finally, the measured process data are used by the micro-computer system to update all its process parameter estimates for use during subsequent passes. The performance prediction/parameter estimation and updating processes are repeated during each subsequent toning pass. To simplify the ensuing discussion of the software, a detailed description of the equations used in each model will be postponed until a later section.

B. Main Control Loop

Figure 8:
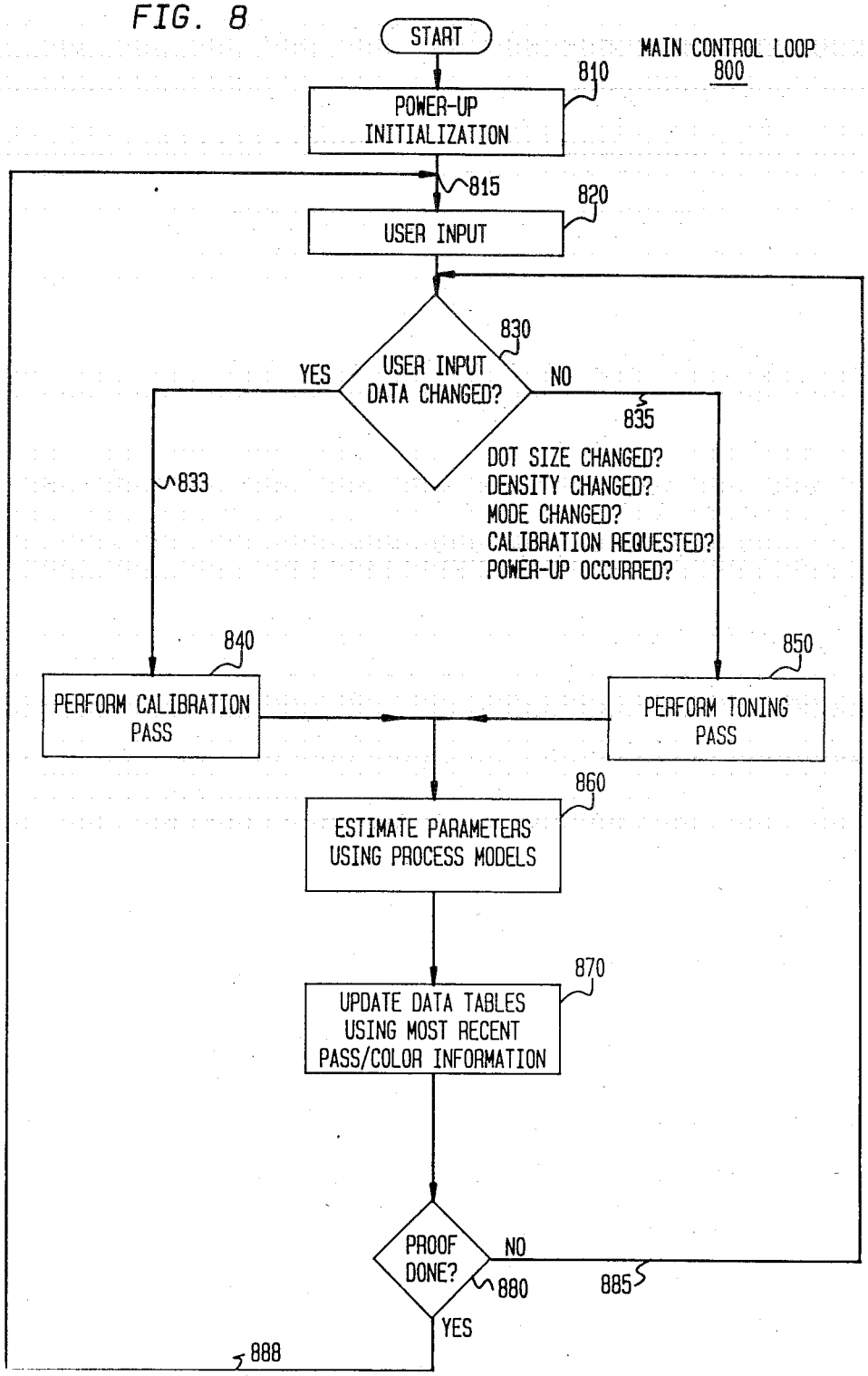
FIG. 8 is a simplified flowchart of the Main Control Loop portion of the software which is used to control the inventive system.

With this overview in mind, a flowchart of the main program loop used in the control program is shown in FIG. 8.

As soon as power is applied to the inventive system, micro-computer system 700 (see FIG. 7) executes block 810 to provide various power-up functions such as initializing parameter values by transferring certain data out of ROM and placing it into RAM. Thereafter, control is transferred, via path 815, to user input routine 820. This routine, explained in detail below in conjunction with FIG. 9, prompts the user for various input parameters, i.e. desired dot size, desired density, desired mode, and whether the calibration phase is to be executed. Thereafter, control is passed to decision block 830. There, the system determines whether the dot size or mode selections mode by the user have changed since the last pass or whether power-up has occurred. In the event that the dot size or mode selections have changed, or if power has just been supplied to the system and power-up initialization has just occurred, then the system must undergo calibration. In that case, control exits from decision block 830, via "YES" path 833, to execution block 840, described in detail below in conjunction with FIG. 10, which causes the inventive system to perform a calibration pass. If on the other hand, none of the user selections have changed and power-up did not recently occur (i.e. the immediately preceding pass was either a calibration pass or a toning pass), then control passes, via "NO" path 835, to execution block 850. Execution of this block, explained in detail below in conjunction with FIG. 11, causes the inventive system to perform a toning pass.

At the conclusion of either the calibration or toning pass, control is passed to execution block 860. During execution of this block, micro-computer system 700 (see FIG. 7) uses the measurement data obtained during the immediately preceding pass (calibration or toning) to calculate and store new sets of parameter estimates (both for process variables and constants) for use in electrophotographic process models (the "models"). Depending upon the parameter, the parameter will be used either during the next toning pass or during the next proof. Those parameters used for the next proof will be used either for the same pass or for the toning pass of the same color as that which was just completed. Once these estimates are complete, the data tables are updated with the resulting parameter estimates.

Once the updating has been completed, execution is transferred to decision block 880 which determines whether the proof has been completed, i.e. all toning passes have been sequentially executed or skipped. If the proof has not been completed, then execution proceeds, via "NO" path 885 to decision block 830. Alternatively, if the proof has been completed, then execution proceeds, via "YES" path 888 to execution block 820 to obtain user input for the next proof.

C. User Input Routine 820

Figure 9:
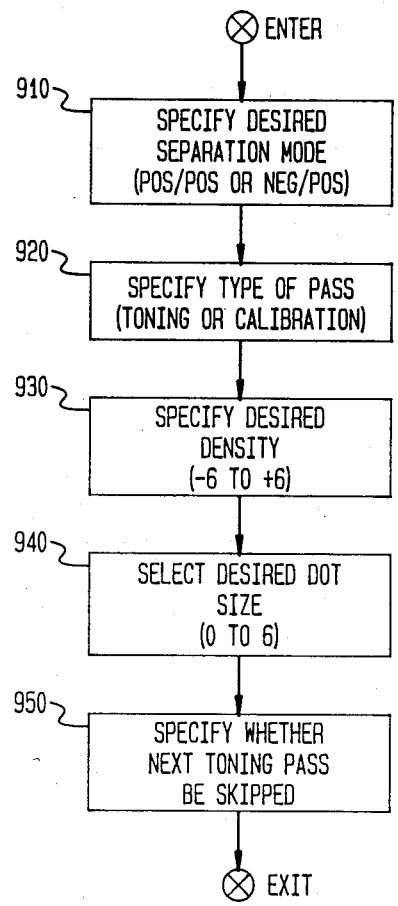
FIG. 9 is a flowchart of User Input Routine 820 shown in FIG. 8.

FIG. 9 depicts a flowchart of User Input Routine 820, shown in FIG. 8.

Upon entry into the user input routine, block 910 is first executed. This block causes a message to appear on display 38 (see FIG. 7) which prompts the user for the desired separation mode, i.e. pos/pos or neg/pos mode. Once the user has indicated his choice by entering it through keyboard 640 (see FIG. 7), execution proceeds to block 920. Here, micro-computer system 700 (also see FIG. 7), prompts the user to specify whether a calibration pass is desired. Once the user has entered his choice through the keyboard, execution proceeds to block 930. During execution of this block, the user is prompted for a desired density value. The user is presented with an arbitrary scale of integer values running from $-6$ through 0 to $+6$, with 0 representing the specification web offset publication (SWOP) density standard. This range of 13 possible density values provides an end-to-end adjustment range of 0.6 standard density units. Once the user has entered his selection through the keyboard, execution then proceeds to block 940. There, the user is prompted through the display to select the desired dot size. In particular, an integer range of 0 to 6 is displayed. This range permits the user to vary dot size in six steps (for example, from 0% to $+15\%$ in neg/pos mode). After the user has entered the desired dot size, execution then proceeds to block 950 which prompts the user for information as to whether any of the toning passes are to be skipped. Although the sequence of toning steps is fixed, individual toning steps can be skipped in this sequence if the user desires. Thereafter, control exits from user input routine 820.

D. Calibration Pass Routine 840

Figure 10:
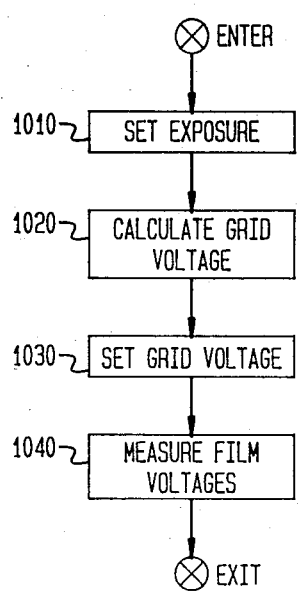
FIG. 10 is a flowchart of Calibration Pass Routine 840 also shown in FIG. 8.

FIG. 10 depicts a flowchart of Calibration Pass Routine 840, shown in FIG. 8.

Upon entry into this routine, control passes to block 1010. This block, explained in detail below in conjunction with FIG. 12, provides exposure control. In particular, during the course of executing this block, the micro-computer system determines the appropriate exposure value for the calibration pass. Once the value is determined, the micro-computer selects the appropriate exposure neutral density filter to use, if any, and determines the proper aperture opening. Thereafter, the micro-computer sends appropriate control signals to exposure neutral density filter motors 7722 and 7723 (see FIG. 7) to slide the proper filter(s) into place. Simultaneously therewith, the micro-computer also adjusts the aperture opening by applying direction information and the necessary amount of pulses to stepper motor controller 766 (also see FIG. 7) to appropriately move the shutter.

Once the appropriate exposure has been set, then control passes to block 1020. Execution of this block produces a calculated value for grid voltage, $V_{grid}$. Once this value has been calculated, it is scaled to a value between $\pm 10$ volts. The micro-computer system then instructs analog output interface circuit 740 (see FIG. 7) to apply an analog voltage equivalent to this scaled voltage to the control input ($V_{in}$) of programmable power supply 762. By doing so, the voltage present on the charging grid is set to the calculated value $V_{grid}$.

Once the grid voltage has been set, control passes to block 1040 which measures the film voltages on the test patches using the electrostatic voltmeter located at the discharge path of the exposure station, i.e. electrostatic voltmeter 28h, and the electrometer located just beyond the yellow toning station, i.e. electrometer 28j (see FIG. 7). As soon as these measurements have been taken, control exits from this routine.

E. Toning Pass Routine 850

Figure 11:
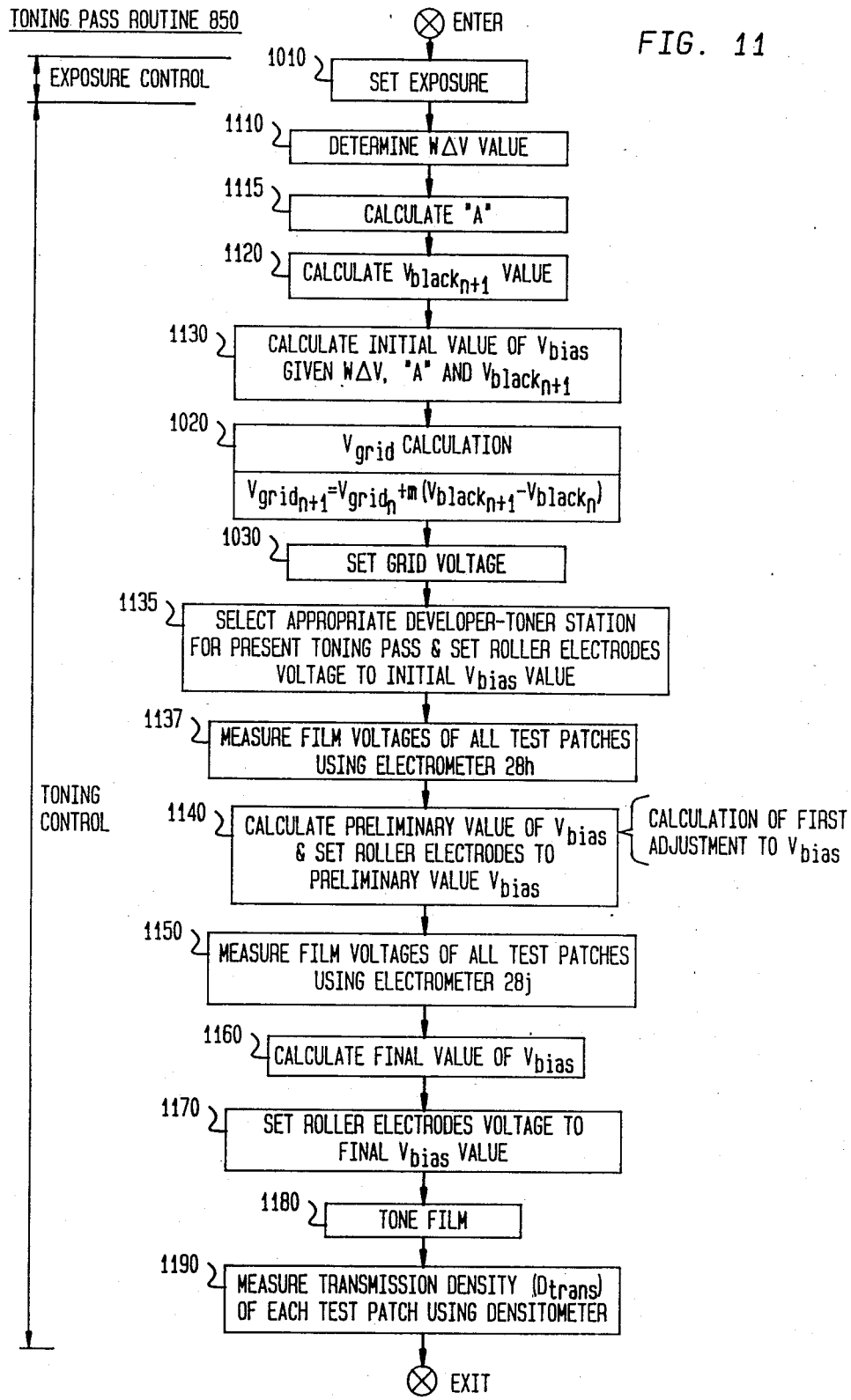
FIG. 11 is a flowchart of Toning Pass Routine 850 also shown in FIG. 8.

FIG. 11 depicts a flowchart of Toning Pass Routine 850, shown in FIG. 8.

Upon entry into this routine, control is first transferred to block 1010 which determines the appropriate exposure value for the mode, and then sets the aperture opening and selects the appropriate exposure neutral density filters, all as described above.

Thereafter, toning control occurs. At this point, block 1110 is first executed by micro-computer system 700 (see FIG. 7) to yield a desired value of working voltage at the development station, referred to as WΔV. The actual value of WΔV is the actual voltage difference that is responsible for placing toner onto the photo-conductive film at any particular toning station. Physically, this voltage is the difference between the voltage existing at the development head, $V_{bias}$, less the voltage existing on the areas of the film to be toned. As described in detail below, the desired WΔV value for the color being toned during the present proof (proof n+1) is dictated primarily by the density chosen by the user and the WΔV value used and the density obtained for that same color during the last proof (proof n). With a value for WΔV calculated, control then passes to block 1115, wherein the exposure value is used to predict the voltage ratio $V_{white}/V_{black}$, which will hereinafter be referred to as value "A". Subsequently, the desired value of $V_{black}$ for the current pass, $V_{black\ (calc)}$, is calculated in block 1120. Once $V_{black}$ has been calculated and stored, control then passes to block 1130 to calculate an initial value of $V_{bias}$ given the values of WΔV, A and $V_{black(calc)}$.

Control then passes to block 1020 wherein the value of grid voltage, $V_{grid}$, is calculated. Thereafter, execution passes to block 1030 which sets the actual voltage on the grid to the calculated $V_{grid}$ value, as described above.

At the conclusion of these steps, micro-computer system 700 (see FIG. 7) executes block 1135 and, in response thereto, applies appropriate digital signals, via digital output interface circuit 750, to select the appropriate development-toner station for the particular toning pass that is to be run. Thereafter, in a similar manner to that executed for the grid voltage, the micro-computer system instructs analog output interface circuit 740 to apply a scaled analog voltage to the control input ($V_{in}$) of programmable power supply 764. By doing so, the high voltage, which is provided as input to high voltage switching relays 770 and from there to the roller electrodes of the selected development-toner station, is the initial value of $V_{bias}$.

At this time, the voltages of all test patches are read using electrostatic voltmeter 28h under control of execution block 1137. The initial $V_{bias}$ value is adjusted to block 1140 to compensate for effect of prediction errors in the equation used to calculate the initial $V_{bias}$, set forth in detail below, to yield a preliminary value of $V_{bias}$.

Once this has occurred, micro-computer system 700 proceeds except in yellow passes, via execution of block 1150, to obtain measurements of the unexposed, exposed and midtone test patch film voltages using electrostatic voltmeter 28j positioned after the yellow development-toner station (see FIG. 7). Thereafter, the bias voltage calculation is repeated using both these film voltage measurements and the preliminary $V_{bias}$ value. This results in a final value of $V_{bias}$. Since by this time, the platen has not reached the selected development head, the bias voltage produced by programmable voltage supply 764 is adjusted, by execution of block 1170, to equal the final $V_{bias}$ value. Thereafter, execution block 1180 is executed which activates various mechanical system components at the selected development-toner station, such as air knives and toner pumps so that the film can be toned. While the film is being toned at the selected development-toner station, block 1190 is also executed in order to obtain a measurement of the transmission density (Dtrans) of each test patch on the toned film. These measurements will be used in updating the data tables. Once all the transmission densities have been measured, control exits from this routine.

F. Set Exposure Routine 1010

FIG. 12 depicts a flowchart of Set Exposure Routine 1010, shown in FIG. 10. This routine provides exposure control.

Upon entry into this routine, control passes to block 1210. Here, micro-computer system 700 (see FIG. 7) accesses a data table to determine an appropriate exposure value ("E"). In a calibration pass, the appropriate exposure value, E, is determined by the user selected mode. Alternatively, if the present pass is a toning pass, the exposure is determined by the user selected dot size, mode and color for the present toning pass. Once this value has been obtained, control passes to block 1220 which, when executed, obtains a value, via analog input interface circuit 670, from exposure lamp intensity monitor 26c indicative of the actual intensity (Iactual) of exposure lamp 26e (see FIG. 7). The micro-computer system then executes block 1230 to access a look-up table of constants to obtain the expected value (Iexp) of the light intensity produced by the exposure lamp.

Now with these values determined, execution passes to block 1240. Here, the micro-computer compares the two intensity values and then adjusts the exposure value, E, to arrive at the adjusted exposure En+1 to compensate for any differences occurring between the actual exposure lamp intensity value, Iactual, and the expected lamp intensity value, Iexp.

At this point, block 1250 is executed to select the appropriate exposure neutral density filter(s) and to calculate the proper exposure aperture size to provide the exposure value En+1. Once this has been accomplished, execution passes to block 1260. Here, micro-computer 700 applies suitable digital signals, via digital output interface circuit 750 and through relays 768, to motor 7722 and/or motor 7723 to move the filter(s) into their proper position within the lamp housing (see FIG. 7). In addition, the micro-computer produces a sequence of digital pulses over leads 763 to cause stepper motor 7721 to appropriately vary the shutter size. In particular, these pulses are applied, via digital output interface circuit 750 and leads 763, to stepper motor controller 766 to cause stepper motor 7721 to incrementally move the shutter to bring the exposure aperture to the appropriate opening. Once the exposure has been properly set, execution exits from this routine.

Electro-photographic Process Models

A. Overview

As noted previously, the control process used in the inventive system utilizes four empirically derived mathematical models to describe the physical electrophotographic processes that actually occur in the inventive proofing system, namely; a charger model, an exposure model, a decay model and a developer model. These models are updated at the end of every pass using measurement data obtained during that pass. In particular, the charger, exposure and decay models are updated at the end of the calibration pass and all the models are updated at the end of every toning pass. At the beginning of each subsequent toning pass for the current proof, the exposure that will be used is determined as previously described and the models are inverted to yield accurate values for all the control parameters $V_{grid}$ and $V_{bias}$ in order to yield maximum system performance, As noted, the initial values used in these models are obtained from the calibration pass. A calibration pass is executed whenever the user changes the input data (i.e. dot size, density or mode), whenever the user instructs the proofing system to execute a calibration pass, or alternatively whenever the system is first powered-up. Calibration calculations use both parameter values obtained from data tables and actual measurements obtained during the calibration pass itself.

The charger model mathematically predicts the voltage placed on the film by the charger grid. The unexposed film voltage $V_{black}$, is linear with charger grid voltage, $V_{grid}$. The exposure model estimates post-exposure film voltages ($V_{midtone}$ and $V_{white}$) that occur in the exposed and less exposed areas on the film as a function of the actual exposures. These post-exposure film voltages are non-linear functions of the actual exposure. The decay model estimates the voltage decay experienced by the film once the film exits the exposure station. The decay is a linear function of the unexposed film voltage and is extrapolated from electrometer 28j to the development-toner station that will be used during the current toning pass using a time scaling multiplier. Lastly, the developer model predict the transmission density of the toned image given the working development voltage, $W\Delta V$. The transmission density is a linear function of the working development voltage.

Figure 13B:
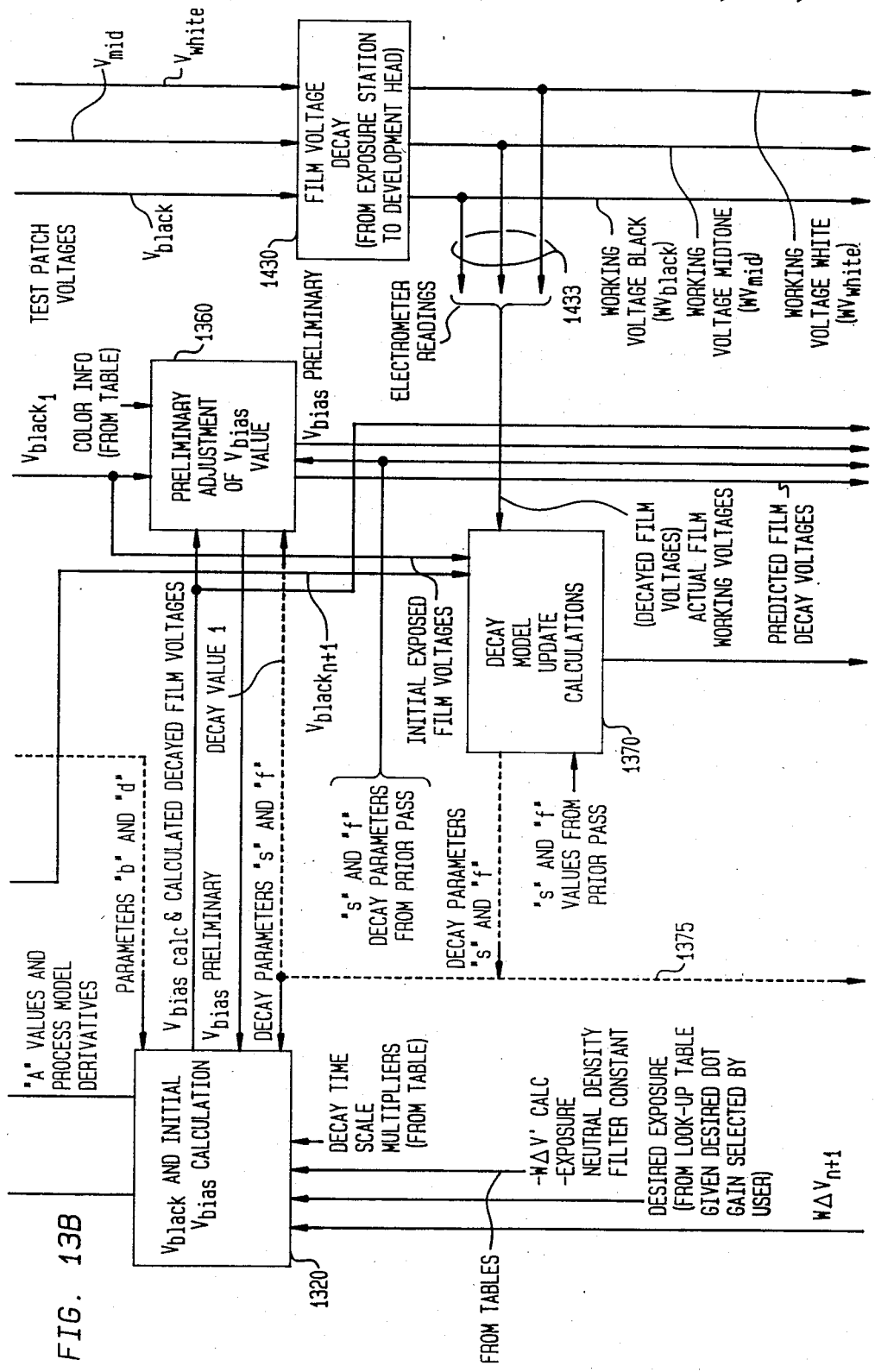

A detailed flowchart of the toning control algorithm used in the inventive system is shown in FIGS. 13A-13C, with the proper alignment of the drawing sheets for these figures shown in FIG. 13.

As shown, the four actual electro-photographic processes occurring in the proofing system are charging process 1410, film exposure process 1420, film voltage decay process 1430 and development (or toning) process 1440—all shown in the extreme right side of this figure. The other boxes in this figure represent calculations. The process calculations responsible for providing toning control are working development voltage calculation 1310, initial $V_{bias}$ and $V_{black}$ calculation 1320, $V_{grid}$ calculation 1330, preliminary $V_{bias}$ adjustment 1360, and final $V_{bias}$ adjustment 1380. Update calculations to the four basic electro-photographic models are shown as charger model update calculations 1340, exposure model update calculations 1350, decay model update calculations 1370 and developer model update calculations 1390. The lines, either solid—e.g. line 1326—or dashed—e.g. line 1375, that connect each calculation box with another calculation box represent parameters that are passed between the separate calculations. Here, the solid lines represent parameters that are applied as input for use in other calculations for the current pass. By contrast, the dashed lines represent inter-pass or inter-proof parameters, i.e. parameters that are not used again for the current pass, but instead are stored for use during the next pass or for the same pass or same color occurring during the next proof. The solid lines that connect a calculation box to a process box represent a calculated value that sets a controlled process parameter, such as line 1338 for $V_{grid}$ and lines 1442 for $V_{bias}$.

Now, with this overview in mind, the discussion will now center on the specific calculations occurring during toning control.

B. Toning Control Calculations

To facilitate understanding of the calculations, the discussion will now assume that all the model parameters have already been updated, either because a calibration pass has just been completed or because a toning pass has just been concluded. Once all the toning control calculations have been discussed under this assumption, the discussion will then center on updating. The following discussion centers on the neg/pos mode. This discussion is equally valid for the pos/pos mode with inter-modal differences noted where applicable.

Inasmuch as no toning occurs during a calibration pass, preliminary $V_{bias}$ adjustment 1360 and final $V_{bias}$ adjustment 1380 are not performed during calibration. By contrast, all the process calculations are performed during a toning pass.

1. Working Voltage Calculations 1310

The following voltages are used in these calculations:

$$W\Delta V = V_{bias} - (V_{image} - V_{decay})$$

where $V_{image}$ is the exposed voltage $V_{white}$ in neg/pos mode and is the unexposed voltage $V_{black}$ in pos/pos mode. $V_{decay}$ is the decay in $V_{image}$ from the exit of the exposure station to the development toner station of the appropriate color.

The value, $W\Delta V$, as previously discussed, is the working voltage at the development-toner station which is responsible for toning the film as it passes over that station. As noted earlier, this voltage is responsible for setting the desired density.

To calculate the value of $W\Delta V$ for the current pass $(n+1)$, the developer model is used in the form:

$$W\Delta V_{n+1} = W\Delta V_n + (D_{n+1} - D_n)/\text{gamma} \quad (1)$$

In this model, a linear difference equation is used to relate the working development voltage for the current color to the working development voltage for the same color on the previous proof and the density difference, where $D_n$ represents the measured transmission density for the same color on the previous proof and $D_{n+1}$ represents the density desired by the user for the current proof. Gamma is the value for the slope of the line represented by equation (1) and is now taken to be a constant. The value of gamma is changed, if necessary, when the developer model is updated at the conclusion of the pass.

2. $V_{black}$ and Initial $V_{bias}$ Calculations 1320

Figure 14:
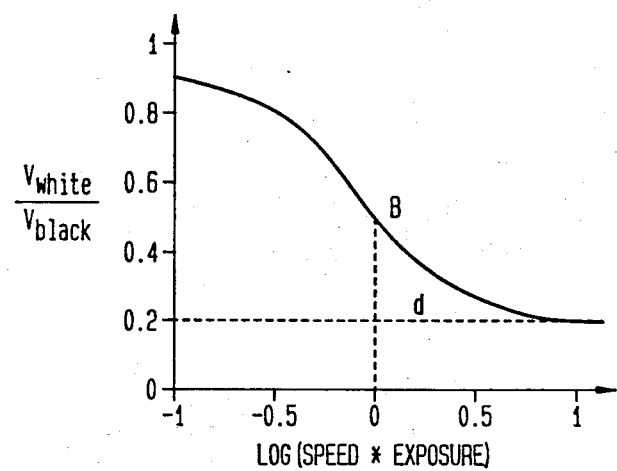
FIG. 14 graphically depicts the exposure model equation.

Now with $W\Delta V$ calculated, the system now predicts the effect of exposure in the current pass. To do so, the exposure value E is obtained using a table look-up as previously described. Given the exposure value and various parameter values and constants, the exposure model is used to relate exposure to A, the ratio of exposed and unexposed voltages:

$$V_{white}/V_{black} = A = (1-d)e^{-(bE)^c} + d \quad (2)$$

where b is a parameter representing the film speed, c is a constant described below and d is a parameter representing the maximum limit of film discharge. This equation is graphically depicted in FIG. 14.

The film speed parameter b can be found from the discharge curve as the inverse of the exposure at which the maximum slope is obtained, i.e. the film speed point B. The maximum discharge parameter d is the lowest A value which can be obtained from exposing the film. The values of both b and d are updated at the conclusion of any toning pass. The value c is a fixed film dependent contrast parameter. The value of constant c is determined empirically and is not updated by the system. A table of appropriate c values is simply stored in memory and appropriately accessed by the exposure model. The value of c changes with pass and mode; therefore, the table contains appropriate c values given mode and pass information.

Now, at this point, the following equation is used to calculate the desired value of $V_{black}$:

$$V_{black\,(calc)} = \pm(W\Delta V + W\Delta V')/(1-A) \qquad (3a)$$

(+ for neg/pos mode, − for pos/pos mode)
except in the first pass of pos/pos mode wherein the differing decays in exposed and unexposed areas of the film require the use of the alternative expression:

$$V_{black\,(calc)} = -\frac{(W\Delta V + W\Delta V + M_{color}(e-f))}{1-A-M_{color}(R-S)} \qquad (3b)$$

Here the different slopes of the decay model, R and S correspond to the different decays in the unexposed and exposed areas, respectively; similarly, for the different intercepts (e and f) of the decay model. The time scaling multiplier $M_{color}$ also appears in this expression.

The working background potential, $W\Delta V'$, is the difference between the bias voltage of the roller electrode of the development toner station and the non-image area decayed voltage as defined by the following equation:

$$W\Delta V = (V_{nonimage} - V_{decay}) - V_{bias}$$

where $V_{nonimage}$ is $V_{black}$ in neg/pos mode and $V_{white}$ in pos/pos mode and $V_{decay}$ is the decay in the nonimage voltage. The voltage $W\Delta V'$ controls background noise. If this voltage becomes too small, then undesired toning will appear in non-image areas. The control process attempts to hold the magnitude of $W\Delta V'$ constant at approximately 100 volts in order to minimize background noise (100 volts for all passes in neg/pos mode, but in pos/pos mode: 55 volts for pass 1, and 50 volts for all subsequent passes).

To calculate an initial value of $V_{bias}$, the system requires data on the expected decay that will occur in the film voltage as the exposed film moves from the exposure station to the particular development toner station used during the current pass. Part of this data is in the form of constants called decay time scaling multipliers. Because decay is assumed to be a linear function of platen position, four decay time scaling multipliers ($M_{color}$) values are stored, each one for a different toning color. The appropriate multiplier is then accessed for the particular color that will be toned. In addition, decay voltage is linearly related to $V_{black}$ as set forth in equation (4a) below:

$$V_{decay} = SV_{black} + f \qquad (4a)$$

except for the decay in the unexposed areas in first pass of pos/pos mode which is given by:

$$V_{decay} = RV_{black} + e \qquad (4b)$$

where S and f (or R and e) are the slope and intercept points of the linear $V_{decay}/V_{black}$ equation. Hereinafter, R and e will be referred to by implication whenever S and f are used for first pass pos/pos mode unexposed area decay. For the current pass, the values of S and f are accessed from a table that was updated at the conclusion of the previous pass with adjusted S and f values, as described below. Now, the initial value of $V_{bias}$ can be calculated as given by equation (5) below:

$$V_{bias}(\text{initial}) = W\Delta V + V_{image} - M_{color} V_{decay}(\text{calc}) \qquad (5)$$

The value of $V_{decay(calc)}$ is a first estimate of the decay voltage and is obtained by substituting the calculated value of $V_{black\,(calc)}$, obtained from equation (3a) or (3b), into equation (4) for $V_{black}$, $V_{image}$ is $V_{white}$ in neg/pos mode and $V_{black}$ in pos/pos mode.

At this point, the initial value of $V_{bias}$ is applied, as depicted by line 1442a, to the roller electrodes at the selected development-toner station that will be used in the present pass and in the specific manner set forth in detail above.

3. $V_{grid}$ Calculations 1330

Now with $V_{black(calc)}$ calculated and also the initial value of $V_{bias}$ calculated and applied to the roller electrodes, the value of voltage $V_{grid}$ for the current pass (n+1) can now be calculated as per equation (6) below:

$$V_{grid(n+1)} = V_{grid(n)} + m(V_{black(calc)} - V_{black(est)}) \qquad (6)$$

where the m is a slope constant that relates the change in voltage $V_{black}$ to the change in grid voltage. The slope constant m is updated at the conclusion of the toning pass by charger model estimation 1340. $V_{black(est)}$ and $V_{grid(n)}$ are the estimated value of $V_{black}$ and the set value of $V_{grid}$ from the previous pass in neg/pos mode and previous proof for the corresponding pass in pos/pos mode. These values are updated at the conclusion of every toning pass, as described in detail below in conjunction with charger model update calculations 1340.

At this point, once the value $V_{grid(n+1)}$ has been calculated, the grid voltage is set to this value, as described in detail above. At approximately the same time, the exposure is also calculated and set as discussed above in conjunction with Exposure Set Routine 1010. Thereafter, the platen moves the film through the charger and exposure stations.

4. Preliminary $V_{bias}$ Calculations 1380

Now at this point, while the film is moving past the exposure station, measurements are being taken by electrostatic voltmeter 28h (see FIG. 7) on the actual film voltages present on the film test patches. These measurements, symbolized by lines 1423 are fed to block 1360 to adjust the initial $V_{bias}$ estimate both for the actual $V_{black}$ (and/or $V_{white}$) values and for the expected decay. This adjustment to $V_{bias}$ determined using equations (7) and (8a or 8b) below:

$$V_{decay(pred)} = SV_{black(measured)} + f \qquad (7)$$

Now, using the predicted decay voltage:
(for pos/pos mode)

$$V_{bias(prelim)} = V_{bias(initial)} + \qquad (8a)$$
$$(V_{black(measured)} - V_{black(calc)}) -$$
$$M_{color}(V_{decay(pred)} - V_{decay(calc)})$$

for neg/pos mode $$V_{bias(prelim)} = V_{bias(initial)} + \qquad (8b)$$
$$(V_{white(measured)} - AV_{black(calc)}) -$$
$$M_{color}(V_{decay(pred)} - V_{decay(calc)})$$

The bias voltage that is actually applied to the roller electrodes is then adjusted to this preliminary value, as symbolized by line 1442b.

5. Final $V_{bias}$ Adjustments

Now, except for yellow toning passes, the non-image test patch and, for some colors, the image test patch voltages have been read by both electrometers, and thus measured decays can be calculated as per equation (9) below:

$$V_{decay(measured)} = V_{28h} - V_{28j} \tag{9}$$

The decay values are now used to make a preliminary estimate of the decay model parameters S and f as in block 1370 described below. This produces a new decay estimate, $V_{decay(est)}$, which is a weighted average between the predicted decay $V_{decay(pred)}$ and the measured decay(s). The averaging weights used are calculated as in block 1370.

With the new estimated decay voltage, the bias voltage is compensated for any differences occurring between the estimated and predicted decay values as per the following equation, in order to yield a final value for $V_{bias}$:

$$V_{bias(final)} = V_{bias(prelim)} - M_{color}(V_{decay(est)} - V_{decay(pred)}) \tag{10}$$

This final $V_{bias}$ value is applied, in the manner set forth in detail above, to the roller electrodes in use for the current pass as symbolized by line 1442c.

The film is now toned. At this point, the actual transmission densities of all the film test patches (exposed, unexposed and midtone) are measured to provide a measurement of the actual density of the toned image on the film.

C. Model Update Calculations

1. Overview of Parameter Estimation Methods

There are three methods used for the estimation of parameters. One, used in developer model estimation, is direct solution of the model equation for the parameter of interest on the basis of measured values. This method will be described in detail on the section on developer model update calculations to follow.

The second estimation method is nonlinear least squares. This method is used in exposure model estimation on a calibration pass. The two parameters of interest are estimated by fitting the model to three data points. The details of this method will be discussed in the context of the exposure model update calculation used for a calibration pass.

The third method, used in all other estimation situations, is adapted from the variable forgetting factor recursive least squares algorithm developed by Dr. B. E. Ydstie at Imperial College in London. See for example B. E. Ydstie et al, "Recursive Estimation with Adaptive Divergence Control", University of Massachusetts Technical Report No. UMASS CHE 84-YD-1R, November 1984, hereinafter referred to as Ydstie. The calculations specific to each of the estimation blocks will be outlined in detail in the discussion of each block. The general form of the method is given in the following section.

2. Overview of Variable Forgetting Factor Recursive Least Squares

This variant of the well-known Kalman filter algorithm is based on the idea of maintaining a constant level of information in the covariance matrix of the parameter uncertainties. This is accomplished by calculating a factor which assesses the novelty of a measurement. The more unexpected the measured value is, the more weight it is given relative to the old data. This results in smooth operation under normal conditions since more old data is then maintained and quicker adaptation to novel conditions since the old data is then forgotten (see Ydstie).

The general form of this filtering algorithm as applied to scalar measurements is described by the following set of equations:

Prediction:

$$x_{predicted} = \Phi x_{old} \tag{11a}$$

$$P = \Phi P \Phi^T \tag{11b}$$

$$y_{predicted} = h(x_{predicted}) \tag{11c}$$

Linearization (if necessary):

$$H = dh/dx \tag{11d}$$

Prediction error:

$$error = e = y_{measured} - y_{predicted} \tag{11e}$$

$$variance = V = R + HPH^T \tag{11f}$$

Calculation of forgetting factor:

$$ff = N/(N + e^2/V) \tag{11g}$$

Gain calculation:

$$K = (HPH^T + ff\underline{R})^{-1}PH^T \tag{11h}$$

Update of parameter:

$$x_{new} = x_{predicted} + Ke \tag{11i}$$

Update of parameter covariance matrix:

$$P = (I - KH)P/ff \tag{11j}$$

In equations (11a) through (11j), y represents the measured response(s), x the parameter(s), $\Phi$ the parameter transition matrix, P the covariance matrix of the parameters, H the linearization of the model equation h, $\underline{R}$ the covariance matrix of the measurement errors and $\overline{N}$ the effective filter memory length (which serves as a tuning parameter).

In order to avoid the potential difficulties of using this algorithm directly on a short word length computer, the covariance matrix P is used and computed throughout in the $UDU^T$ factorized form where U is an upper triangular matrix with ones on the diagonal and D is a diagonal matrix. (See P. S. Maybeck, *Stochastic Models, Estimation and Control* (®, 1979 Academic Press, Orlando), pp. 392–394.)

3. Charger Model Update Calculations 1340

These calculations occur after either a toning or calibration pass. The two parameters estimated by these calculations are $V_{black}$ and the inverse of the slope m of the charger model. Both of these parameters are used in the calculation of $V_{grid}$ in the previously described calculation block 1330. The estimated value of $V_{black}$ from this block is also used in the decay model update calculation block 1370 which will be discussed in detail below. The calculations of this block proceed according to the $UDU^T$ factorized form of the variable forgetting factor algorithm outlined above.

The prediction step of the algorithm, following the procedure of equations (11a) through (11c), can be expressed by equations (12a) through (12d) using the old values, $V_{black(est)}$ $(1/m)_{(est)}$ and $V_{grid(n)}$, obtained from memory:

$$V_{black(pred)} = V_{black(est)} + (V_{grid(n+1)} - V_{grid(n)})(1/m)_{est} \quad (12a)$$

$$(1/m)_{(pred)} = (1/m)_{(est)} \quad (12b)$$

Note that since the new value of $V_{grid}$ is calculated in calculation block 1330 to precisely yield the desired value of $V_{black}$ as calculated in block 1320, i.e. $V_{black(calc)}$, equation (12a) is redundant and is shown here only to justify the calculation used to produce the covariance matrix of predictions $V_{black(pred)}$ and $(1/m)_{(pred)}$.

Since the implied parameter transition matrix $\Phi$ used in equations (12a) and (12b) is unit upper triangular, the $UDU^T$ form of the update of P corresponding to equation (11b) is accomplished by multiplying $\Phi$ times U, which only requires the recomputation of the off diagonal element of U, u, via the equation:

$$u = u + V_{grid(n+1)} - V_{grid(n)} \quad (12c)$$

Then the measured value is predicted as in equation (11c) to yield:

$$V_{black(meas\ pred)} = V_{black(pred)} \quad (12d)$$

This completes the prediction step of the algorithm.

The row vector H implied in equation (12d), which corresponds to the model derivative calculation (11d), is simply $H = [1\ 0]$.

Next, the prediction error and the variance of the prediction error are computed. The prediction error equation equivalent to equation (11e) is:

$$err = V_{black(meas)} - V_{black(meas\ pred)} \quad (12e)$$

and the variance of the prediction error, which is equivalent to equation (11f), is:

$$V = \underline{R} + d_1 + d_2 u^2 \quad (12f)$$

where $d_1$ and $d_2$ are the diagonal elements of the D factor of P and $\underline{R}$ is the appropriate variance of the measured value of $V_{black}$ which will be discussed later.

Next, the forgetting factor, ff, is calculated as in equation (11g) by:

$$ff = N/(N + err^2/V) \quad (12g)$$

Then the gains to be used in the update equations are calculated as per equation (11h):

$$gain_{(Vblack)} = (d_1 + d_2 u^2)/(ff\underline{R} + d_1 + d_2 u^2) \quad (12h)$$

$$gain_{(1/m)} = (d_2 u)/(ff\underline{R} + d_1 + d_2 u^2) \quad (12i)$$

Next, the parameters are updated as in equation (11i) by using the following equations:

$$V_{black(est)} = V_{black(predicted)} + gain_{(Vblack)} err \quad (12j)$$

$$(1/m)_{(est)} = (1/m)_{(pred)} + gain_{(1/m)} err \quad (12k)$$

Finally, the $UDU^T$ factors of P are updated as an equation (11j) by:

$$d_2 = d_2(1 - gain_{(1/m)} u)/ff \quad (12l)$$

$$u = \underline{R}\ gain_{(1/m)}/d_2 \quad (12m)$$

$$d_1 = \underline{R}(1 - gain_{(Vblack)})/ff - d_2 u^2 \quad (12n)$$

The updated values of the parameters and covariance matrix factor elements are then stored in memory for later use.

For toning passes, the value used for $\underline{R}$, stored in ROM 715 (see FIG. 7c) represents the variance of a single electrometer reading. Since a calibration pass produces three unexposed test patches, the values associated with these test patches are averaged to obtain the measured value used in the algorithm above. Therefore, the value used for $\underline{R}$ for charger model update calculations for a calibration pass is one-third of that used for updating the charger model for a toning pass.

4. Exposure Model Update Calculations 1350

These calculations use measured voltages to estimate two parameters of the exposure model, namely b and d, and their covariance matrix factorization. The algorithms used in calibration and toning passes are distinct as noted in the overview of the model update calculations above. Although both algorithms are members of the least squares family, that used in a calibration pass calculates totally fresh estimates whereas that used in toning passes does not totally disregard past history, i.e. old parameter estimates.

The method used in calibration passes is a well-known nonlinear least squares algorithm which uses as its computational core a QR factorization of the model derivative matrix H defined in equation (11d). The core calculations are performed as described in G. H. Golub and C. L. VanLoan, *Matrix Computations*, (© 1983, The Johns Hopkins University Press, Baltimore) pp. 152ff. Since the speed parameter b is nonlinearly involved in the exposure model, the full algorithm consists of linearizing the model about an initial set of parameter values, using the aforementioned linear least squares core to calculate an updated set of parameters and repeating this procedure until convergence is obtained. After the converged parameters are obtain, the final set of QR factors are used to obtain the well-known estimate of the covariance matrix of the parameters based on an estimate of the covariance matrix of the measurement errors. This matrix is then factorized into $UDU^T$ form for use during toning passes.

In calibration passes, the nine test patches are given four levels of exposure; three are unexposed, two are exposed with no test patch filters interposed between the test patch and the exposure lamp, two with a single test patch filter interposed and two with both test patch filters interposed. The exposures delivered to the six exposed areas are chosen to obtain good estimates of the model parameters. Measured voltage values of corresponding patches are averaged together and then three A values are calculated by forming the ratios of the exposed voltages to the unexposed voltage. These three measured values are then fit in a least squares sense by the aforementioned nonlinear least squares algorithm, producing the parameter and parameter covariance estimates.

The method used during toning passes is a variant of the variable forgetting factor algorithm described above but adapted to the case of multiple measurements. In this variant, the model derivative matrix and the prediction errors are premultipled by a matrix to be described below to obtain values which can be processed by the scalar algorithm. An additional variation is the use of two separate memory lengths (and forgetting factors) for the parameters b and d to reflect their relative levels of variability. Other than these two variations, the method used is very similar to that used in the charger model update calculations.

Specifically, the prediction phase calculations are first performed. In this situation, the parameter transition matrix, $\Phi$, is an identity matrix since the predicted parameter values are the old values. Thus, neither equation (11a) nor (11b) needs to be calculated. The two predicted A measurements corresponding to equation (11c) are calculated via the exposure model equation (2) using the parameter values, the exposure used to expose the film and that exposure as attenuated by the midtone filter(s) used.

Next, the linearization of the model is computed by substituting the aforementioned parameter and exposure values into the analytically derived expressions for the derivative of the model with respect to the parameters. These four values comprise the model matrix H, with the rows indexed by exposure level and the columns by parameter value.

Next, the predicted values of the voltage ratios are subtracted from the A values calculated from the ratios of the measured exposed and unexposed voltages to form a column vector e of measurement errors.

Since the two ratios are computed using the same measured value of unexposed voltage and since the two exposures which gave rise to the observed ratios are constant multiples of each other, the errors induced by these common disturbance sources cause a correlation in the measurement errors associated with the A values. Thus in this case, not only is $\underline{R}$ not a scalar, it is not even a diagonal matrix. However, the $UDU^T$ factorization of $\underline{R}$ can be computed and used to reduce the problem to an equivalent one which has a diagonal measurement covariance matrix. Once this uncorrelated form is obtained, the two transformed measurements may be processed by the scalar algorithm in turn. In particular, if we define the matrix $\underline{H}$ and the column vector $\underline{e}$ by the matrix expressions $\underline{H} = U^{-1}H$ and $\underline{e} = U^{-1}e$, then the entries of $\underline{e}$ and the corresponding rows of $\underline{H}$ together with the corresponding diagonal element of $\underline{D}$ (which serves in the place of $\underline{R}$) can be processed through the remaining portions of the forgetting factor algorithm (equations (11e) through (11j).

The second variation used is the application of multiple forgetting factors. In this variation, rather than multiplying $\underline{R}$ by the forgetting factor when calculating the gains and dividing P (or equivalently, D) by the forgetting factor when updating the parameter covariance matrix, a generalization of the equivalent formulation, wherein P (or equivalently, D) is divided by the forgetting factor prior to the gain calculation, is used. Two separate forgetting factors based on the same prediction error and prediction error variance but having differing filter memory lengths, N, are computed. These factors are placed on the diagonal of a matrix F, and subsequently P is multiplied on the left and right by the diagonal inverse square root of F. In the $UDU^T$ form of the algorithm actually used, this step is accomplished by the equations:

$$d_1 = d_1/f_1, \quad d_2 = d_2/f_2 \text{ and } u = u(f_2/f_1)^{\frac{1}{2}}.$$

After this computation, the remainder of the algorithm is carried out using equations equivalent to equations (11h) through (11j) appropriate for the $UDU^T$ form with the forgetting factor set to 1.

5. Decay Model Update Calculations 1370

These calculations occur after either a toning or calibration pass. The parameters estimated by these calculations are the slope(s) S and the intercept(s) f of the decay model(s). These parameters are used in the previously described calculation block 1320. The estimated values of working voltage from this block described below are also used in the developer model update calculation block 1390 discussed in detail below. The calculations of decay model update block 1370 proceed according to the $UDU^T$ factorized form of the variable forgetting factor algorithm outlined above.

The prediction step of the algorithm generically specified by equations (11a) through (11c) is accomplished using $\Phi$ as an identity matrix and by the decay model equation and the value of $V_{black(est)}$ provided by charger model update calculations 1340, as per the following equation:

$$V_{decay(meas\,pred)} = S_{(pred)} V_{black(est)} + f_{(pred)} \qquad (13a)$$

This completes the prediction step of the algorithm.

The row vector H implied in equation 13a which corresponds to the model derivative calculation (11d) is simply $H = [V_{black(est)} 1]$.

Next, the prediction error and the variance of the prediction error are computed. The prediction error equation equivalent to equation (11e) which uses the measured decay is explained in detail below:

$$\text{err} = V_{decay(meas)} - V_{decay(meas\,pred)} \qquad (13b)$$

and the variance of the prediction error equation equivalent to equation (11f) is:

$$V = \underline{R} + d_1 + d_2(u + V_{black(est)})^2 \qquad (13c)$$

where $d_1$ and $d_2$ are the diagonal elements of the D factor of P, u is the off diagonal element of U and $\underline{R}$ is the appropriate variance of the measured value of $V_{decay}$ which will also be discussed later.

Next, the forgetting factor is calculated as in equation (11g) by:

$$f\!f = N/(N + \text{err}^2/V) \qquad (12g)$$

Then the gains to be used in the update equations are calculated by equations equivalent to equation (11b), namely:

$$V_{total} = f\!f \underline{R} + d_1 + d_2(u + V_{black(est)})^2 \qquad (13d)$$

$$\text{gain}_{(S)} = d_1(u + V_{black(est)})/V_{total} \qquad (13e)$$

$$\text{gain}_{(f)} = d_2/V_{total} + u\,\text{gain}_{(S)} \qquad (13f)$$

$$S_{(est)} = S_{(pred)} + \text{gain}_{(S)}\text{err} \qquad (13g)$$

$$f_{(est)} = f_{(pred)} + \text{gain}_{(f)}\text{err} \qquad (13h)$$

$$V_{subtotal} = ff\underline{R} + d_2 \tag{13i}$$

$$u = u - d_2(u + V_{black(est)})/V_{subtotal} \tag{13j}$$

$$d_2 = d_2\underline{R}/V_{subtotal} \tag{13k}$$

$$d_1 = d_1 V_{subtotal}/V_{total} \tag{13l}$$

The updated values of the parameters and covariance matrix factor elements are then stored in memory for later use.

There are six different cases of calculations performed by block 1370, depending upon mode, pass and type of pass from which data is taken. For the first case, toning passes of neg/pos mode or toning passes after the first pass of pos/pos mode, the decay measurement used above is the average of the three voltage differences from electrometer 28h to electrometer 28j of the white, midtone and black test patches. If the toning pass is the first pass in pos/pos mode, the algorithm is executed twice to estimate the different slope and intercept parameters, S and f, used for decays on unexposed and exposed areas separately. In these two cases, the two decays measured on exposed (white and midtone) test patches are averaged and the measured decay on the unexposed test patch is processed as is.

Corresponding to the three cases above, the value of $\underline{R}$ used is $\frac{2}{3}$, 1 and 2 times the stored value of the electrometer variance.

When calibration passes occur, which are always the first pass of the proof, there are 3 analogous cases. In neg/pos mode, the decays of all 9 test patches are averaged and $\underline{R}$ is 2/9 times the stored variance. In the second case, in pos/pos mode, the decays of the six exposed test patches are averaged and $\underline{R}$ is $\frac{1}{3}$ of the stored variance. In the third case, in pos/pos mode, the decays of the three unexposed test patches are averaged and $\underline{R}$ is $\frac{2}{3}$ of the stored variance.

After the parameters are estimated and stored in toning passes, the working voltages (WV) of the test patches are calculated by the equations:

$$WV_{midtone} = V_{midtone(meas)} - M_{color}V_{decay(midtone\ est)} \tag{14}$$

$$WV_{image} = V_{image} - M_{color}V_{decay(image\ est)} \tag{15}$$

wherein the decay estimates are based on the appropriate parameter estimates and $V_{black(est)}$ and $V_{image}$ is either the measured value of $V_{white}$ in neg/pos mode or the estimated value $V_{black(est)}$ in pos/pos mode. The measured values used here are those obtained from electrometer 28h.

6. Developer Model Update Calculations 1390

All the actual transmission density measurements are applied, as symbolized by lines 1443, to developer model update calculations 1390 to update the developer model parameters. Inasmuch as density varies linearly with working voltage, the actual value of the slope gamma (see equation (1)) above) can be determined using two actual data points: the actual transmission density for a completely exposed test patch, $D_{trans(image)}$, and the actual transmission density for a partially exposed test patch, $D_{trans(midtone)}$, along with the corresponding estimated working voltage values for these test patches provided by block 1370 above. Partial exposure is obtained using the test patch neutral density filters, as discussed above. The densities of the filters are chosen to assure that the measured differences in densities and voltages between a full density and a midtone test patch are sufficiently large to afford a relatively noise-free estimate of the slope parameter, gamma. The following equation is used to re-calculate gamma:

$$gamma = \frac{D_{trans(image)} - D_{trans(midtone)}}{abs(WV_{image} - WV_{midtone})} \tag{16}$$

If a midtone patch is not available, then values of $D_{trans(midtone)}$ and $WV_{midtone}$ are both set to zero. The resulting value of gamma is stored in memory for use for that color during the next proof. A separate value of gamma is stored for use for each color. Hence, during any proof, separate new values of gamma are calculated for each toned color and stored for use during the following proof.

Inasmuch as no toning occurs during a calibration pass, the developer model update calculations are not performed during calibration. These calculations are only performed at the conclusion of each toning pass.

Apparatus 10 has been built and tested. High quality proofs were generated in less than thirty minutes and that there was good consistency from proof to proof. The dot gain achieved at high exposures was greater than was expected from the theory discussed herein. Various mechanisms could explain this result such as multiple internal scattering and/or reflectance, and/or halation, etc.

Although a specific illustrative embodiment has been shown and described herein, this merely illustrates the principles of the present invention. Clearly, many varied arrangements embodying these principles may be devised by those skilled in the art without departing from the spirit and scope of the present invention. For example, the development electrode-toner apparatus can be replaced with a variety of other well-known devices which perform the same function. One example of such an apparatus is given in U.S. Pat. No. 4,358,195. Furthermore, any number of half-tone separations can be used to form a proof using apparatus 10 of the present invention. Still further, in some systems the charging apparatus can be eliminated since it is not necessary to precharge some record members in order to place a pattern on same. In some systems, the exposure and development apparatus are effectively merged together into apparatus which may be denoted as forming apparatus or forming means for forming a visual pattern on a record member. A recording member in such systems can, for example, be a dielectric film with a conductive backing which can be charged directly in a half-tone pattern by a controlled ion source (ionography) and developed, for example, as outlined above in apparatus 10. A second example uses a stylus array to create a charge pattern on a dielectric medium. In such a system, styli are addressed and raised to a sufficient potential to create a discharge by the Paschen effect to be subsequently developed as in the Versatec electrostatic plotter system. A third example, requiring the use of a photoconductive film which either retains or loses persistent conductivity upon exposure, could be exposed to obtain a latent image which could be developed using a biased electrode development station. Still further, the input halftone patterns used by such systems could be obtained by means other than those used in the apparatus described. For example, they could be generated directly from the original artwork by such devices as graphic arts scanners. Still further, in each of these examples, a source half-tone pattern can be electronically manipulated to give virtually any relationship desired between the size of dots in the source pattern and the size of dots on a generated proof.

What is claimed is:

1. Apparatus for generating from half-tone patterns, a proof which is formed of dots and is derived from a record member that is adapted to selectively maintain an electrical pattern, the apparatus comprising:

forming means for forming an electrical pattern on the record member which is a reproduction of the half-tone patterns, the forming means being operative in response to a signal;

the record member being adapted to facilitate generation of a proof which comprises a visual representation comprised of a plurality of dots of the electrical pattern;

dot size control means for generating and varying the signal so as to control the size of dots on the proof; and the proof having an acceptable relationship to a press sheet printed on a printing press derived from the same half-tone patterns.

2. Apparatus for generating from half-tone patterns, a proof which is formed of dots and is derived from a record member that is adapted to selectively maintain an electrical pattern, the apparatus comprising:

charging means selectively coupled to the record member for causing a preselected amount of charge to be deposited on the record member, the charging means being operative in response to a first signal;

forming means for forming an electrical pattern on the record means which is a reproduction of the half-tone patterns, the forming means being operative in response to a second signal;

the record member being adapted to facilitate generation of a proof which comprises a visual representation comprised of a plurality of dots of the electrical pattern;

dot size control means for generating and cooperatively varying the first and second signals; and the proof having an acceptable relationship to a press sheet printed on a printing press which uses printing plates derived from the same half-tone patterns.

3. Electrophotographic apparatus for generating from a set of halftone patterns formed of dots, a proof which is formed of dots and is derived from a record member that is adapted to selectively maintain an electrical pattern, the apparatus comprising:

charging means selectively coupled to the record member for causing a preselected amount of charge to be deposited on the record member, the charging means being operative in response to a first signal;

exposure means for exposing the record member in the presence of the half-tone patterns to a source of radiation which results in the information contained in the half-toned patterns being reproduced on the record member, the exposure means being operative in response to a second signal;

development means for producing from the pattern containing record member, the proof which comprises a visual representation of the record member, the development means being operative in response to a third signal; and dot size control means for generating and cooperatively varying the first, second, and third signals so as to control the size of the dots on the proof.

4. Electrophotographic apparatus for generating from a set of half-tone color separations formed of dots and derived from artwork, a proof which is formed of dots and is derived from a component of an electrophotographic record member that is adapted to maintain an electrical charge, the proof having an acceptable relationship to the artwork and to a press sheet comprised of dots and printed on a printing press which uses printing plates derived from the same separations, the apparatus comprising:

charging means selectively coupled to the record member for causing a preselected amount of charge to be deposited on the record member, the charging member being operative in response to a first signal;

exposure means for exposing the record member in the presence of the half-tone separations to radiation which results in the information contained in the half-tone separations being reproduced on the record member, the exposure means being operative in response to a second signal;

development means for producing from the record member which contains the information of the half-tone separations, the proof which comprises a visual representation of the information contained on the record member, the development means being operative in response to a third signal; and dot size control means for generating and cooperatively varying the first, second, and third signals so as to control the size of dots on the proof.

5. The apparatus of claim 4 wherein the source of radiation is a light source.

6. The apparatus of claim 5 wherein:

the exposure means comprises shutter means which are adapted to open and close so as to control the amount of light which reaches a separation and a record member; and the exposure means further comprises filter means which are adapted to be placed so as to control the amount of light which reaches a separation and a record member.

7. The apparatus of claim 6 wherein the shutter means and the filter means are responsive to the second signal.

8. The apparatus of claim 7 wherein the development means comprises a development electrode.

9. The apparatus of claim 8 wherein the development means comprises a plurality of development stations with each development station comprising a development electrode.

10. The apparatus of claim 9 wherein potentials of the development electrodes are responsive to the third signal.

11. The apparatus of claim 10 wherein the charging means comprises a plurality of grid conductors and a plurality of corona conductors.

12. The apparatus of claim 11 wherein a potential of the grid conductors is responsive to the first signal.

13. The apparatus of claim 12 further comprising platen means adapted to receive a record member which has a photoconductive layer.

14. The apparatus of claim 13 wherein the platen is capable of movement along a path and comprises means for receiving a photoconductive record member and a separation.

15. The apparatus of claim 14 wherein the charging means, the exposure means, and the development means are located along the path.

16. The apparatus of claim 15 wherein the dot size control means comprises control electronics.

17. The apparatus of claim 16 wherein the control electronics comprises a process control element.

18. The apparatus of claim 17 wherein the control electronics further comprises random access memory and read only memory.

19. Electrophotographic apparatus for generating a proof from a set of half-tone color separations comprising:
- platen means for receiving a photoconductive record member;
- means for receiving on said platen a half-tone color separation which is placed between the platen and a photoconductive record member;
- charging means including a control grid for applying a controlled charge potential on a photoconductive record member;
- means for controlling the exposure of a photoconductive layer of a photoconductive record member through a separation to a suitable source of radiant energy to form a latent electrostatic image of a pattern carried by said separation;
- a plurality of development electrodes for developing said resulting latent electrostatic image with a selected one of a plurality of color toners;
- means for controlling the voltage on said selected development electrode during a toning operation; and
- means for controlling the dot size of an image formed on a photoconductive record member by cooperatively varying the exposure, the grid potential on said charger and the potential on said selected development electrode.

20. An electrophotographic color imaging apparatus for generating a proof from a set of half-tone color separations comprising:
- platen means for receiving a photoconductive record member;
- means for receiving on said platen a half-tone separation which is placed between the platen and said photoconductive record member;
- charging means including a control grid for applying a controlled charge potential on a photoconductive record member;
- means for controlling the exposure of a photoconductive layer of a photoconductive record member through a separation to a suitable source of radiant energy to form a latent electrostatic image of a pattern carried by said separation;
- a plurality of development electrodes for developing said resulting latent electrostatic image of a pattern carried by said separation;
- a plurality of development electrodes for developing said resulting latent electrostatic image with a selected one of a plurality of color toners;
- means for controlling the voltage on said selected development electrode during a toning operation; and
- means for controlling the dot size in the image formed on said photoconductive record member by cooperatively varying the grid potential on said charger and the potential on said selected development electrode for a given exposure.

21. A method for controlling electrophotographic apparatus which generates a proof from a set of half-tone separations, wherein said apparatus provides a reproduction of a press sheet that would be produced using printing plates derived from said separations by controllably toning a pre-defined color onto said proof during each one of a series of successively occurring toning passes, said method comprising the steps of:
- predicting performance using models of various electrophotographic processes that will occur within said apparatus during the present toning pass for a pre-selected one of said colors;
- providing, in response to said performance predictions, a value of at least one control parameter for use in controlling the actual performance of said apparatus during the toning pass;
- toning the pre-selected color onto said proof;
- measuring an actual value of at least one process parameter, indicative of the actual performance of said apparatus, occurring during the present toning pass for said pre-selected color; and
- updating, after said pre-selected color has been toned onto said proof, at least one coefficient value appearing in at least one of said models, using the measured process parameter value, for use during the next successive toning pass occurring for said proof or for a corresponding toning pass for a subsequently occuring proof.

22. The method in claim 21 wherein the performance predicting step includes the step of predicting, using at least one model of said electrophotographic processes occuring in said apparatus, the actual performance of said processes that will occur during the present toning pass.

23. The method of claim 22 further comprising the steps of:
- charging a photoconductive film to a selected voltage level, said film subsequently being successively toned by one of each of said pre-defined colors;
- exposing said film through a pre-selected one of said half-tone separations to a pre-selected level of light so as to define localized discharged regions on said film corresponding to said separation; and
- toning said film using toner of said pre-selected color.

24. The method of claim 23 wherein the predicting step further comprises the step of utilizing pre-defined models of electrophotographic charging, exposure, and development processes occurring in said system to predict the actual performance of each of said electrophotographic processes occurring in said system, wherein each of said models characterizes a corresponding one of said electrophotographic processes in terms of at least one pre-defined mathematical function that utilizes a plurality of coefficient values and relates applicable control parameters to appropriate measured process parameters.

25. The method in claim 24 wherein the predicting step further includes the step of predicting, in response to a decay model, an amount of decay in film voltage that is expected to occur between the time the film has been exposed and the time the film is toned.

26. The method in claim 25 wherein the predicting step further includes the step of predicting the performance of said system during said present toning pass using each of said pre-defined models and most recently updated coefficient values.

27. The method in claim 26 further comprised of the steps of:

predicting unexposed film voltage using the charger model, wherein the unexposed film voltage is a linear function of the grid voltage applied to the charger;

predicting at least one post-exposure film voltage using the exposure model, wherein the post-exposure film voltage is a non-linear function of the exposure value;

predicting film decay voltage using the decay model, wherein the film decay voltage is a linear function of unexposed film voltage; and predicting transmission density of a toned image on said film using the developer model, wherein the density is a linear function of a working development voltage.

28. The method in claim 21 wherein the providing step includes the steps of:

providing, in response to said models, a value of grid voltage for controlling said charging process;

providing, in response to selected dot size, an exposure value for use in controlling the exposure process; and providing, in response to said models, a value of bias voltage for controlling said development process.

29. The method in claim 28 wherein the exposure value providing step includes the step of selecting, in response to said exposure value, an appropriate neutral density filter and shutter size to suitably set the actual exposure used in the system.

30. The method in claim 29 wherein the exposure value providing step further includes the steps of:

measuring the actual intensity produced by a lamp which provides said light;

determining a value indicative of the expected intensity that should be produced by said lamp; and adjusting the exposure value to compensate for any variations occurring between the actual and expected intensity.

31. The method in claim 21 wherein the updating step includes the step of varying, in response to said measured values, the coefficients appearing in each of said models so as to compensate for any differences occurring between the predicted and actual performance of the system.

32. A method for use in controlling electrophotographic apparatus which generates a proof from a set of half-tone separations, wherein said apparatus provides a reproduction of a press sheet that would be produced using printing plates derived from said separations by controllably toning a pre-defined color onto said proof during each one of a series of successively occurring toning passes, said method comprising a calibration pass phase followed by at least one toning pass phase, wherein the calibration pass phase comprises the steps of:

obtaining initial measurement of at least one pre-defined characteristic indicative of initial system performance; and updating at least one coefficient value appearing in at least one model which mathematically describes a corresponding electrophotographic process that occurs in the apparatus; and wherein said toning pass phase comprises the steps of:

predicting performance, using said model with said updated coefficient value, of said electrophotographic process that will occur during the present toning pass for a pre-selected one of said colors; and providing, in response to said performance predictions, a value of at least one control parameter for use in controlling the actual performance of said apparatus during the toning pass;

toning the pre-selected color onto said proof;

measuring an actual value of at least one process parameter, indicative of the actual performance of said apparatus, occurring during the present toning pass for said pre-selected color; and updating, after said pre-selected color has been toned onto said proof, said coefficient value, using the measured process parameter value, for use during the next successive toning pass occurring for said proof or for a corresponding toning pass in a subsequently occurring proof; and repeating said toning pass phase for each remaining toning pass needed for the present proof.

33. The method in claim 32 wherein the calibration phase further includes the step of: measuring an initial value of at least one process parameter occurring during a calibration pass during which a photoconductive film, that subsequently will be toned to produce said proof, is fed through said apparatus, said process parameter being indicative of the actual performance of said apparatus occurring during the calibration pass.

34. The method in claim 33 wherein the calibration phase updating step further includes the steps of:

predicting performance of said electrophotographic process that occur within said apparatus during said calibration pass, using said model and a stored value; and generating, in response to said performance predictions and said measured process parameter, an updated value of said coefficient appearing in said model.

35. The method in claim 34 wherein the calibration step further comprises the step of utilizing pre-defined models of electrophotographic charging, exposure and decay processes occurring in said system to predict the actual performance of each of said electrophotographic processes occurring in said system during said calibration pass.

36. The method in claims 32 or 35 wherein the performance predicting step includes the step of predicting, using at least one model of said electrophotographic processes occurring in said apparatus, the actual performance of said processes that will occur during the present toning pass.

37. The method in claim 36 further comprising the steps of:

charging a photoconductive film to a selected voltage level, said film subsequently being successively toned by one of each of said pre-defined colors;

exposing said film through a pre-selected one of said half-tone separations to a selected level of light so as to define localized discharged regions on said film corresponding to said separation; and toning said film using toner of said pre-selected color.

38. The method in claim 37 wherein the predicting step further comprises the step of utilizing pre-defined models of electrophotographic charging, exposure, and development processes occurring in said system to predict the actual performance of each of said electrophotographic processes occurring in said system, wherein each of said models characterizes a corresponding one of said electrophotographic processes in terms of at least one pre-defined mathematical function that utilizes a plurality of coefficient values and relates applicable control parameters to appropriate measured process parameters.

39. The method in claim 38 wherein the predicting step further includes the step of predicting, in response to a decay model, an amount of decay in film voltage that is expected to occur between the time the film has been exposed and the time the film is toned.

40. The method in claim 39 wherein the predicting step further includes the step of predicting the performance of said system during said present toning pass using each of said pre-defined models and most recently updated coefficient values.

41. The method in claim 40 further comprised of the steps of:
predicting unexposed film voltage using the charger model, wherein the unexposed film voltage is a linear function of the grid voltage applied to the charger;
predicting at least one post-exposure film voltage using the exposure model, wherein the post-exposure film voltage is a non-linear function of the exposure value;
predicting film decay voltage using the decay model, wherein the film decay voltage is a linear function of unexposed film voltage; and
predicting transmission density of a toned image on said film using the developer model, wherein the density is a linear function of a working development voltage.

42. The method in claim 36 wherein the providing step includes the steps of:
providing, in response to said models, a value of grid voltage for controlling said charging process;
providing, in response to selected dot size, an exposure value for use in controlling the exposure process; and
providing, in response to said models, a value of bias voltage for controlling said development process.

43. The method in claim 42 wherein the exposure value providing step includes the step of selecting, in response to said exposure value, an appropriate neutral density filter and shutter size to suitably set the actual exposure used in the system.

44. The method in claim 43 wherein the exposure value providing step further includes the steps of:
measuring the actual intensity produced by a lamp which provides said light;
determining a value indicative of the expected intensity that should be produced by said lamp; and
adjusting the exposure value to compensate for any variations occurring between the actual and expected intensity.

45. The method in claim 36 wherein the updating step includes the step of varying, in response to said measured values, the coefficients appearing in each of said models so as to compensate for any differences occurring between the predicted and actual performance of the system.

46. Electrophotographic apparatus for generating a proof from a set of half-tone separations, wherein said apparatus provides a reproduction of a press sheet that would be produced using printing plates derived from said separations by controllably toning a pre-defined color onto said proof during each one of a series of successively occurring toning passes, said apparatus comprising:
means for predicting performance using models of various electrophotographic processes that will occur within said apparatus during the present toning pass for a pre-selected one of said colors, and
means for providing, in response to said performance predictions, a value of at least one control parameter for use in controlling the actual performance of said apparatus during the toning pass;
means for toning the pre-selected color onto said proof;
means for measuring an actual value of at least one process parameter, indicative of the actual performance of said apparatus, occurring during the present toning pass for said pre-selected color; and
means for updating, after said pre-selected color has been toned onto said proof, at least one coefficient value appearing in at least one of said models, using the measured process parameter value, for use during the next successive toning pass occurring for said proof or for a corresponding toning pass in a subsequently occurring proof.

47. The apparatus in claim 46 wherein the means for predicting the performance includes means for predicting, using at least one model of said electrophotographic processes occurring in said apparatus, the actual performance of said processes that will occur during the present toning pass.

48. The apparatus in claim 47 further comprising:
means for charging a photoconductive film to a selected voltage level, said film subsequently being successively toned by one of each of said pre-defined colors;
means for exposing said film through a pre-selected one of said half-tone separations to a pre-selected level of light so as to define localized discharged regions on said film corresponding to said separation; and
means for toning said film using toner of said pre-selected color.

49. The apparatus in claim 48 wherein the means for predicting step further comprises means for utilizing pre-defined models of electrophotographic charging, exposure, and development processes occurring in said system to predict the actual performance of each of said electrophotographic processes occurring in said system, wherein each of said models characterizes a corresponding one of said electrophotographic processes in terms of at least one pre-defined mathematical function that utilizes a plurality of coefficient values and relates applicable control parameters to appropriate measured process parameters.

50. The apparatus in claim 49 wherein the predicting means further comprises means for predicting, in response to a decay model, an amount of decay in film voltage that is expected to occur between the time the film has been exposed and the time the film is toned.

51. The apparatus in claim 50 wherein the predicting means further comprises means for predicting the performance of said system during said present toning pass using each of said pre-defined models and most recently updated coefficient values.

52. The apparatus in claim 51 further comprising:
means for predicting unexposed film voltage using the charger model, wherein the unexposed film voltage is a linear function of the grid voltage applied to the charger;
means for predicting at least one post-exposure film voltage using the exposure model, wherein the post-exposure film voltage is a non-linear function of the exposure value;

means for predicting film decay voltage using the decay model, wherein the film decay voltage is a linear function of unexposed film voltage; and means for predicting transmission density of a toned image on said film using the developer model, wherein the density is a linear function of a working development voltage.

53. The apparatus in claim 46 wherein the providing means comprises:

means for providing, in response to said models, a value of grid voltage for controlling said charging process;

means for providing, in response to selected dot size, an exposure value for use in controlling the exposure process; and means for providing, in response to said models, a value of bias voltage for controlling said development process.

54. The apparatus in claim 46 wherein the updating means comprises:

means for varying, in response to said measured values, the coefficients appearing in each of said models so as to compensate for any differences occurring between the predicted and actual performance of the system.

55. Electrophotographic apparatus for generating a proof from a set of half-tone separations, wherein said apparatus provides a reproduction of a press sheet that would be produced using printing plates derived from said separations by controllably toning a pre-defined color onto said proof during each one of a series of successively occurring toning passes, said apparatus and means for performing at least one toning pass, wherein the calibration pass performing means comprises:

means for obtaining initial measurements of at least one pre-defined characteristic indicative of initial system performance; and means for updating at least one coefficient value appearing in at least one model which mathematically describes a corresponding electrophotographic process that occurs in the apparatus; and wherein said toning pass performing means comprises:

means for predicting performance, using said model with said updated coefficient value, of said electrophotographic process that will occur during the present toning pass for a pre-selected one of said colors; and means for providing, in response to said performance predictions, a value of at least one control parameter for use in controlling the actual performance of said apparatus during the toning pass;

means for toning the pre-selected color onto said proof;

means for measuring an actual value of at least one process parameter, indicative of the actual performance of said apparatus, occurring during the present toning pass for said pre-selected color;

means for updating, after said pre-selected color has been toned onto said proof, said coefficient value, using the actual process parameter value, for use during the next successive toning pass occurring for said proof or for a corresponding toning pass in a subsequently occurring proof; and means for repeating said toning pass phase for each remaining toning pass needed for the present proof.

56. The apparatus in claim 55 wherein the calibration pass performing means further comprises means for measuring an initial value of at least one process parameter occurring during a calibration pass during which a photoconductive film, that subsequently will be toned to produce said proof, is fed through said apparatus, said process parameter being indicative of the actual performance of said apparatus occurring during the calibration pass.

57. The apparatus in claim 56 wherein the calibration pass updating means further comprises:

means for predicting performance of said electrophotographic process that occur within said apparatus during said calibration pass, using said model and a stored value; and means for generating, in response to said performance predictions and said measured process parameter, an updated value of said coefficient appearing in said model.

58. The apparatus in claim 57 wherein the calibration pass performing means further comprises means for utilizing pre-defined models of electrophotographic charging, exposure and decay processes occurring in said system to predict the actual performance of each of said electrophotographic processes occurring in said system during said calibration pass.

59. The apparatus in claims 55 or 58 wherein the performance predicting means comprises means for predicting, using at least one model of said electrophotographic processes occurring in said apparatus, the actual performance of said processes that will occur during the present toning pass.

60. The apparatus in claim 59 comprising:

means for charging a photoconductive film to a selected voltage level, said film subsequently being successively toned by one of each of said pre-defined colors;

means for exposing said film through a pre-selected one of said half-tone separations to a pre-selected level of light so as to define localized discharged regions on said film corresponding to said separation; and means for toning said film using toner of said pre-selected color.

61. The apparatus in claim 60 wherein the predicting means further comprises means for utilizing pre-defined models of electrophotographic charging, exposure, and development processes occurring in said system to predict the actual performance of each of said electrophotographic processes occurring in said system, wherein each of said models characterizes a corresponding one of said electrophotographic processes in terms of at least one pre-defined mathematical function that utilizes a plurality of coefficient values and relates applicable control parameters to appropriate measured process parameters.

62. The apparatus of claim 61 wherein the predicting means further comprises means for predicting, in response to a decay model, an amount of decay in film voltage that is expected to occur between the time the film has been exposed and the time the film is toned.

63. The apparatus in claim 62 wherein the predicting means further comprises means for predicting the performance of said system during said present toning pass using each of said pre-defined models and most recently updated coefficient values.

64. The apparatus in claim 59 wherein the providing means comprises:
   means for providing, in response to said models, a value of grid voltage for controlling said charging process;
   means for providing, in response to selected dot size, an exposure value for use in controlling the exposure process; and
   means for providing, in response to said models, a value of bias voltage for controlling said development process.

65. The apparatus in claim 59 wherein the updating means comprises:
   means for varying, in response to said measured values, the coefficients appearing in each of said models so as to compensate for any differences occurring between the predicted and actual performance of the system.

* * * * *